United States Patent
Yokou et al.

(10) Patent No.: US 9,368,189 B2
(45) Date of Patent: *Jun. 14, 2016

(54) SEMICONDUCTOR DEVICE INCLUDING OUTPUT CIRCUIT CONSTITUTED OF PLURAL UNIT BUFFER CIRCUITS IN WHICH IMPEDANCE THEREOF ARE ADJUSTABLE

(71) Applicant: PS4 Luxco S.a.r.l., Luxembourg (LU)

(72) Inventors: Hideyuki Yokou, Tokyo (JP); Koji Uemura, Kokubunji (JP); Manabu Ishimatsu, Kokubunji (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 81 days.

This patent is subject to a terminal disclaimer.

(21) Appl. No.: 14/295,213

(22) Filed: Jun. 3, 2014

(65) Prior Publication Data

US 2014/0286109 A1    Sep. 25, 2014

Related U.S. Application Data

(63) Continuation of application No. 13/649,060, filed on Oct. 10, 2012, now Pat. No. 8,766,664.

(30) Foreign Application Priority Data

Oct. 11, 2011 (JP) ................. 2011-223741

(51) Int. Cl.
| | |
|---|---|
| *H03K 19/003* | (2006.01) |
| *G11C 11/4076* | (2006.01) |
| *H03K 17/16* | (2006.01) |
| *H03K 19/00* | (2006.01) |
| *G11C 11/4093* | (2006.01) |
| *G11C 5/14* | (2006.01) |
| *G11C 29/02* | (2006.01) |
| *H03K 19/0185* | (2006.01) |

(52) U.S. Cl.
CPC ............ *G11C 11/4076* (2013.01); *G11C 5/147* (2013.01); *G11C 11/4093* (2013.01);
(Continued)

(58) Field of Classification Search
CPC ............................................. H03K 19/018571
USPC .......................................... 326/26, 27, 30, 87
See application file for complete search history.

(56) References Cited

U.S. PATENT DOCUMENTS

| | | |
|---|---|---|
| 7,215,128 B2 | 5/2007 | Fujisawa |
| 7,495,453 B2 | 2/2009 | Fujisawa |

(Continued)

FOREIGN PATENT DOCUMENTS

JP    2006-203405 A    8/2006

OTHER PUBLICATIONS

Notice of Allowance in U.S. Appl. No. 13/649,060 dated Feb. 26, 2014.

*Primary Examiner* — Don Le
(74) *Attorney, Agent, or Firm* — Kunzler Law Group, PC

(57) ABSTRACT

A semiconductor device includes an output circuit having a plurality of unit buffer circuits, an impedance of each unit buffer circuit of the plurality of unit buffer circuits being adjustable, a control circuit configured to selectively activate one or more unit buffer circuits of the plurality of unit buffer circuits, and an impedance adjustment unit configured to adjust the impedance of each of the unit buffer circuits of the plurality of unit buffer circuits. The impedance adjustment unit includes a first power line, a replica circuit, and a load current generation circuit. The replica circuit and the load current generation circuit are coupled in common to the first power line, the replica circuit has a replica impedance that is substantially equal to the impedance of the output circuit, and the load current generation circuit changes current flowing therethrough.

20 Claims, 17 Drawing Sheets

(52) U.S. Cl.
CPC ............ *G11C29/022* (2013.01); *G11C 29/028* (2013.01); *H03K 17/167* (2013.01); *H03K 19/0005* (2013.01); *H03K 19/018571* (2013.01); *G11C 2207/2254* (2013.01)

(56) References Cited

U.S. PATENT DOCUMENTS

| 7,808,270 | B2 | 10/2010 | Fujisawa |
| 8,018,246 | B2 | 9/2011 | Kaiwa et al. |
| 8,198,911 | B2 | 6/2012 | Fujisawa |
| 2004/0080336 | A1 | 4/2004 | Hirano |
| 2006/0158198 | A1 | 7/2006 | Fujisawa |
| 2007/0194798 | A1 | 8/2007 | Fujisawa |
| 2009/0146756 | A1 | 6/2009 | Fujisawa |
| 2011/0001511 | A1 | 1/2011 | Fujisawa |
| 2012/0217992 | A1 | 8/2012 | Fujisawa |
| 2013/0088257 | A1* | 4/2013 | Hara ................ H03K 19/00315 326/30 |
| 2013/0321057 | A1* | 12/2013 | Soussan ............. H01L 27/1203 327/319 |
| 2015/0115999 | A1* | 4/2015 | Lee ................ H03K 19/017545 326/30 |
| 2015/0280713 | A1* | 10/2015 | Jung ................ H03K 19/00361 326/34 |

* cited by examiner

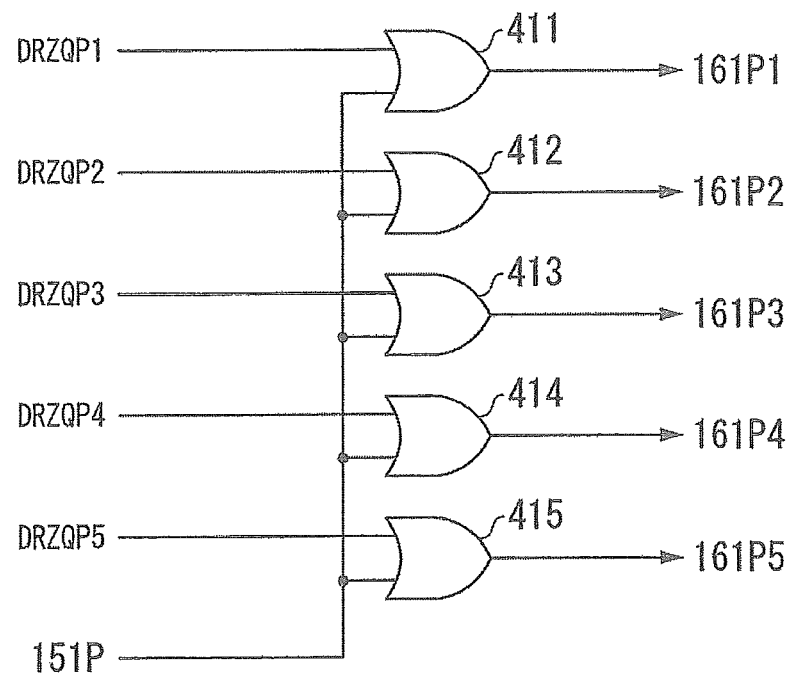
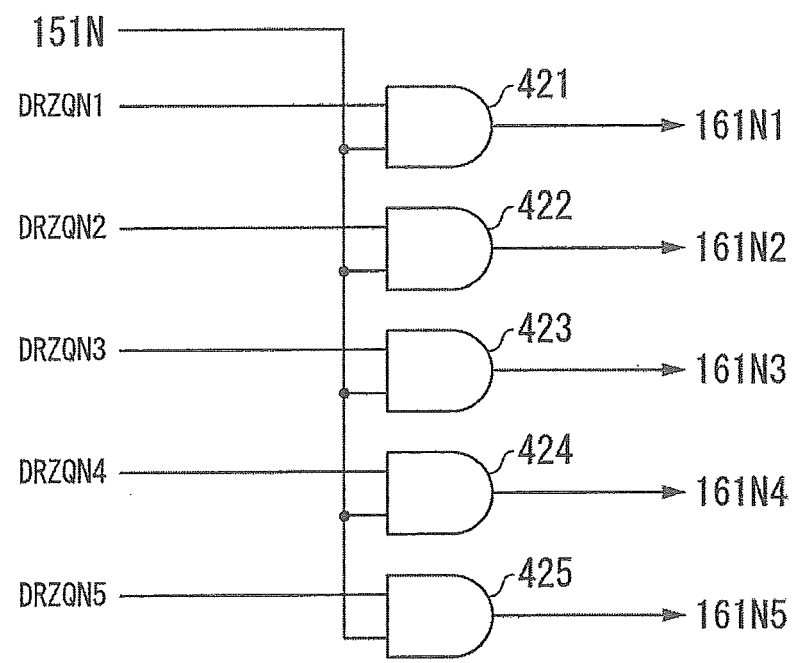
FIG.4

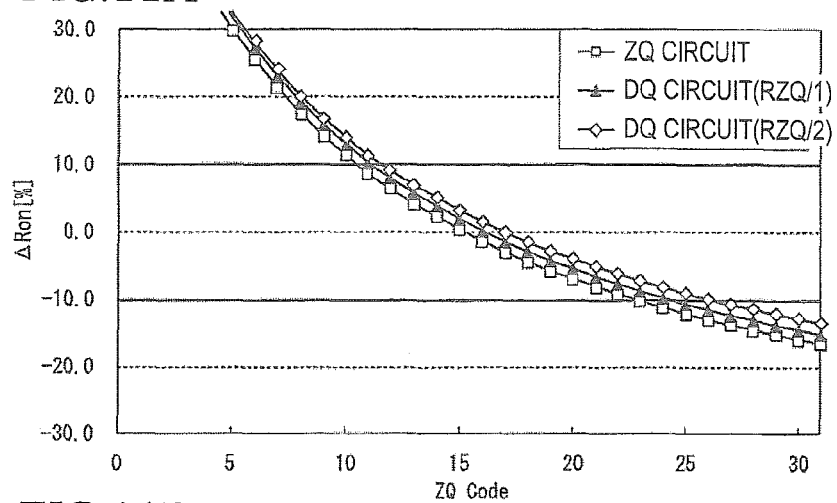
FIG.11A RZQ/2
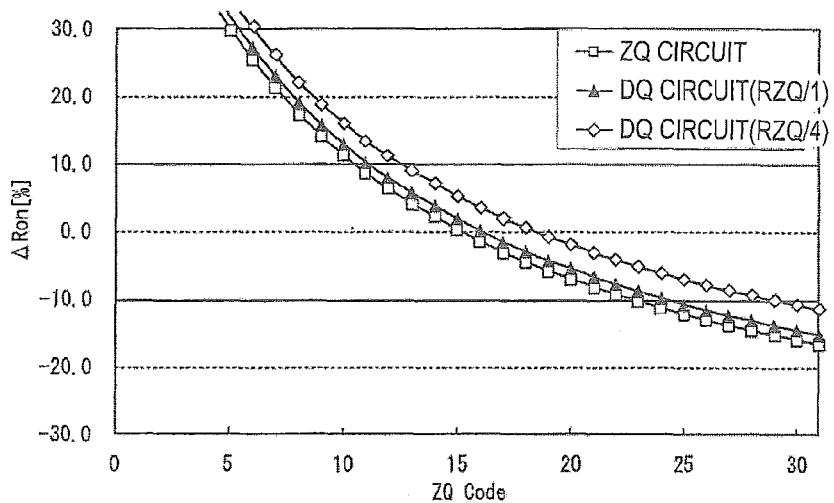
FIG.11B RZQ/4
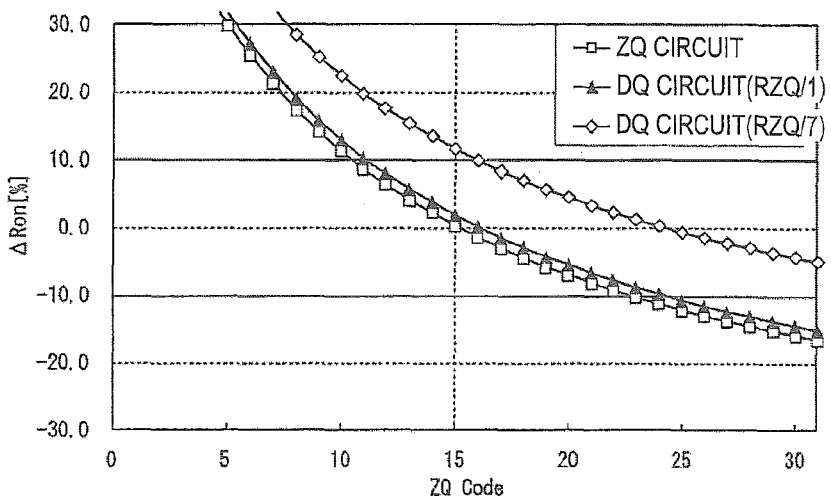
FIG.11C RZQ/7

SEMICONDUCTOR DEVICE INCLUDING OUTPUT CIRCUIT CONSTITUTED OF PLURAL UNIT BUFFER CIRCUITS IN WHICH IMPEDANCE THEREOF ARE ADJUSTABLE

The present application is a Continuation Application of U.S. patent application Ser. No. 13/649,060 filed on Oct. 10, 2012, which is based on and claims priority from Japanese Patent Application No. 2011-223741, filed on Oct. 11, 2011, the entire contents of which are incorporated herein by reference.

BACKGROUND OF THE INVENTION

1. Field of the Invention

The present invention relates to a semiconductor device that includes an impedance adjustment unit.

2. Description of Related Art

As a data transfer speed between semiconductor devices increases, impedance of an output circuit is needed to become more accurate.

In particular, some DRAMS, which are one type of semiconductor memory, are so formed as to be able to change the impedance of an output circuit thereof at the time of data outputting in accordance with the impedance of a data bus connected to the DRAMs.

For example, Japanese Patent Application Laid-Open No. 2006-203405 shows a semiconductor device including an impedance adjustment unit that is designed to adjust the impedance of an output circuit. More specifically, the output circuit includes a plurality of unit buffer circuits; an impedance adjustment unit provided in common to the unit buffer circuits to adjust the impedances of the unit buffer circuits in common to a desired impedance. By changing the number of unit buffer circuits that are activated at the time of data outputting, the output circuit drives an output terminal with a required impedance.

The impedance adjustment unit uses a replica circuit corresponding to one unit buffer circuit to adjust the impedances of the unit buffer circuits in common. Meanwhile, the output circuit uses one or more unit buffer circuits to drive the output terminal. In this manner, if the output circuit uses two or more unit buffer circuits to drive the output terminal, the number of the unit buffer circuits that actually drive the output terminal is not reflected in the impedance adjustment unit. In the output circuit, according to the number of the unit buffer circuits activated, the voltage drop (and voltage rise) between a power supply line and a unit buffer circuit varies. Therefore, in the impedance adjustment process of Japanese Patent Application Laid-Open No. 2006-203405, there is concern that the impedance of the output circuit could deviate from the required impedance.

SUMMARY

In one aspect of this disclosure, there is provided a semiconductor device comprising an output circuit having a plurality of unit buffer circuits, wherein an impedance of each unit buffer circuit of the plurality of unit buffer circuits is adjustable; a control circuit configured to selectively activate one or more unit buffer circuits of the plurality of unit buffer circuits; and an impedance adjustment unit configured to adjust the impedance of each of the unit buffer circuits of the plurality of unit buffer circuits, wherein the impedance adjustment unit comprises a first power line, a replica circuit, and a load current generation circuit, and wherein the replica circuit and the load current generation circuit are coupled in common to the first power line, the replica circuit has a replica impedance that is substantially equal to the impedance of the output circuit, and the load current generation circuit changes current flowing therethrough in accordance with a number of the activated one or more unit buffer circuits of the plurality of unit buffer circuits, and wherein the load current generation circuit comprises a comparator having an output that is used to selectively change the current flowing through the load current generation circuit.

In another aspect of this disclosure, there is provided a device comprising: a first terminal; a plurality of output buffers coupled in common to the first terminal; an output control circuit receiving a first control signal and activating one or ones of the output buffers in response to the first control signal; and an impedance adjustment unit including a replica circuit, a plurality of current generation circuits and a power line, the replica circuit and the current generation circuits being coupled in common to the power line, the impedance adjustment unit adjusting an impedance of each of the output buffers in response to an impedance of the replica circuit, the impedance adjustment unit further including a current control circuit receiving the first control signal and activating one or ones of the current generation circuits in response to the first control signal.

In still another aspect of this disclosure, there is provided a system comprising a control device and a memory device coupled to the control device. The memory device comprising: a first terminal coupled to the control device; a plurality of output buffers coupled in common to the first terminal; an output control circuit receiving a first control signal and activating one or ones of the output buffers in response to the first control signal; and an impedance adjustment unit including a replica circuit, a plurality of current generation circuits and a power line. The replica circuit and the current generation circuits are coupled in common to the power line. The impedance adjustment unit adjusts an impedance of each of the output buffers in response to an impedance of the replica circuit. The impedance adjustable circuit further includes a current control circuit receiving the first control signal and activating one or ones of the current generation circuits in response to the first control signal.

According to the present invention, the impedance adjustment unit changes the quantity of current flowing through the impedance adjustment unit in accordance with the number of unit buffer circuits selectively activated, in the load current generation circuit that is connected in parallel to the replica circuit. Therefore, the impedance of the replica circuit is adjusted in accordance with the number of unit buffer circuits. The result of adjusting the impedance of the replica circuit, which is adjusted in accordance with the number of unit buffers, is reflected in the process of adjusting the impedance of the output circuit. As a result, it is possible to improve the accuracy of adjusting the impedance of the output circuit.

BRIEF DESCRIPTION OF THE DRAWINGS

FIG. 4 is a circuit diagram of the pre-stage circuit;

FIGS. 11A-11C are diagrams for explaining Ron deviation of the output buffer based on the number of unit buffers;

DETAILED DESCRIPTION OF THE EMBODIMENTS

The invention will be now described herein with reference to illustrative embodiments. Those skilled in the art will recognize that many alternative embodiments can be accomplished using the teaching of the present invention and that the invention is not limited to the embodiments illustrated for explanatory purpose.

Figure 1:
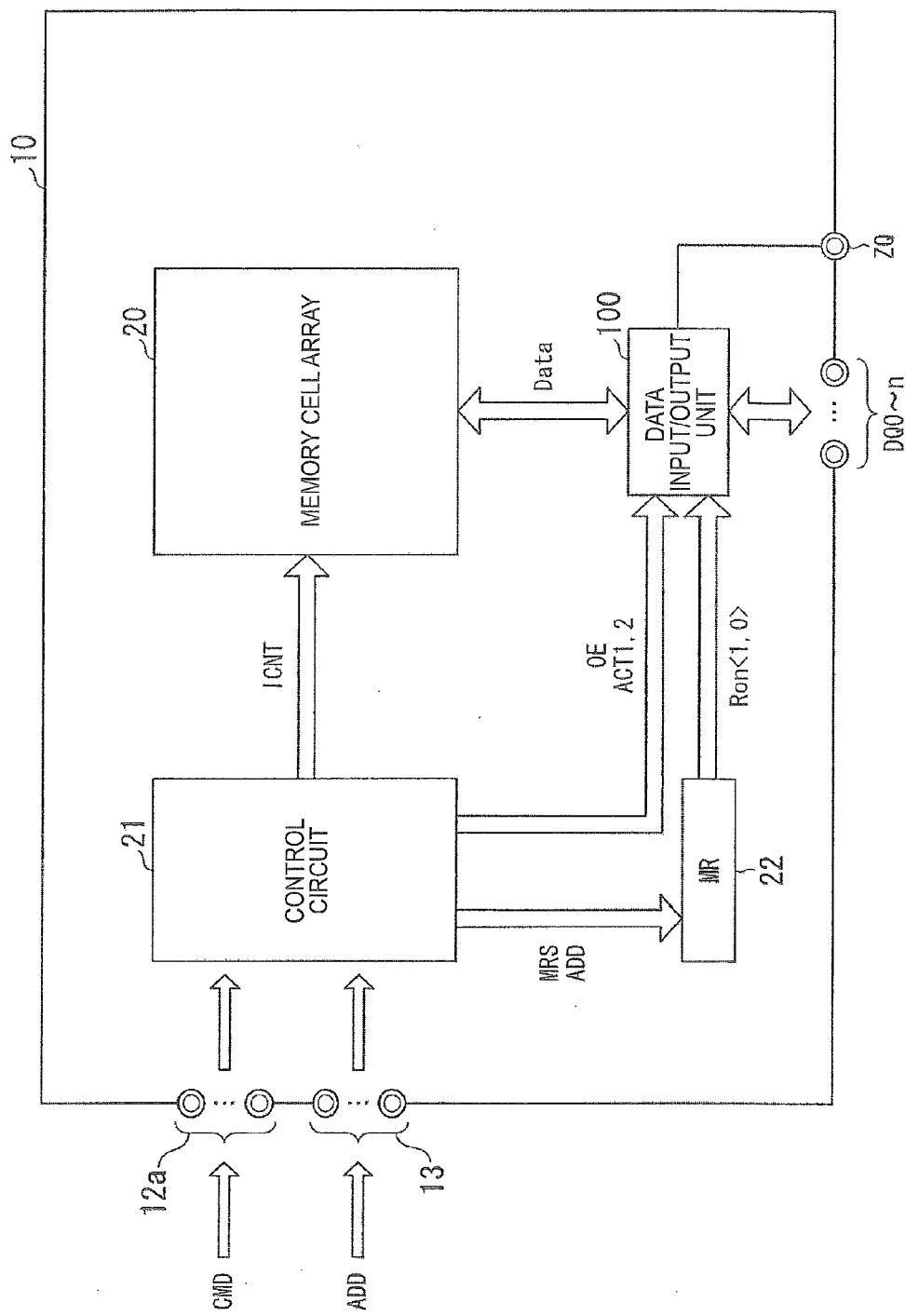
FIG. 1 is a block diagram of the semiconductor device.

FIG. 1 schematically shows the configuration of a semiconductor device 10 at a time when the present invention is applied to a semiconductor device, or to a SDRAM (Synchronous Dynamic Random Access Memory) that operates in synchronization with a clock signal supplied from outside, for example. Incidentally, all the circuit blocks shown in FIG. 1 are formed on the same semiconductor chip made of single crystal silicon. For example, the circuit blocks each are made up of a plurality of transistors, such as PMOS transistors (P-channel MOS transistors) and NMOS transistors (N-channel MOS transistors). Those indicated by symbol ○(circle) are pads that serve as external terminals provided on the semiconductor chip.

The semiconductor device 10 includes a memory cell array 20, a control circuit 21, a mode register 22, and a data input/output unit 100.

The data input/output unit 100, which is one of the features of the semiconductor device 10 of the present invention, has a DS function. The DS (Driver Strengthen) function is of adjusting the impedance of an output buffer at the time of data outputting. The semiconductor device 10 enables the DS function by changing the number of unit buffers activated in accordance with an impedance setting code Ron <1, 0> (or an impedance setting signal). The unit buffers make up the output buffer.

The DS function will be detailed later. First, the following outlines the semiconductor device 10.

The semiconductor device 10 includes the following as external terminals (or pads on the semiconductor chip): command terminals 12a, address terminals 13, data terminals DQ0 to DQn, and a calibration terminal ZQ. The semiconductor device 10 also includes other external terminals, such as clock terminals and power supply terminals; the other external terminals, however, are not shown in the diagram because the other external terminals are substantially unrelated to the present invention.

The command terminals 12a collectively represent terminals to which a row address strobe signal /RAS, a column address strobe signal /CAS, a write enable signal /WE, a chip select signal /CS, and any other signal are supplied, for example. A combination of signals input into the above terminals makes up a command signal CMD. The command terminals 12a are connected to the control circuit 21.

The address terminals 13 are terminals to which address signals ADD are supplied, and are connected to the control circuit 21.

The data terminals DQ are terminals for outputting read data and inputting write data, and are connected to the data input/output unit 100. The data input/output unit 100 is also connected to the calibration terminal ZQ. A calibration operation (described later) in the data input/output unit 100 is carried out after an external resistance is connected to the calibration terminal ZQ.

The memory cell array 20 includes a plurality of word lines, a plurality of bit lines, and a plurality of memory cells; the memory cells are disposed at the intersections of the word and bit lines.

The control circuit 21 supplies various operation control signals ICNT, which are used to control an operation of the memory cell array 20, to the memory cell array 20 in accordance with a command signal CMD supplied from outside via the command terminals 12a, and address signals ADD supplied from outside via the address terminals 13.

By supplying various operation control signals ICNT to the memory cell array 20, the control circuit 21 controls a read operation and a write operation: the read operation is reading data from memory cells in the memory cell array 20; and the write operation is writing data to memory cells.

More specifically, when the command signal CMD is a read command (RD command), the control circuit 21 supplies an output enable signal OE to the data input/output unit 100; the control circuit 21 also controls the memory cell array 20 in such a way that data of a memory cell specified by address signals ADD are output to the data input/output unit 100 as data "Data". When the command signal CMD is a write command (WT command), the control circuit 21 controls the data input/output unit 100 and the memory cell array 20 in such a way that data "Data" accepted by the data input/output unit 100 from outside are written into a memory cell specified by address signals ADD among the memory cells of the memory cell array 20.

When a command indicating the execution of a calibration operation (or CAL command) is supplied from outside via the command terminals 12a as a command signal CMD, the control circuit 21 supplies a control signals ACT1 and ACT2 to the data input/output unit 100.

When a mode register set command (MRS command) is supplied from outside via the command terminals 12a as a command signal CMD, the control circuit 21 supplies to the mode register 22 the address signals ADD that are supplied to the address terminals 13 at a time when the MRS command is supplied, along with the mode register set signal MRS.

The mode register 22 (MR) changes various settings of the semiconductor device 10 in accordance with a mode register set signal MRS supplied from the control circuit 21 and address signals ADD. More specifically, in the case of FIG. 1, the mode register 22 supplies to the data input/output unit 100 an impedance setting code Ron <1, 0> to set the impedances of output circuits of the data input/output unit 100. As described later, the impedance setting code Ron <1, 0> is used at a time when data are output in the data input/output unit 100, or a signal that specifies the number of unit buffers activated at a time when data are output during a read operation.

Incidentally, according to the present embodiment, for example, among the address signals ADD, the logic level of an address signal A1 corresponds and is equal to the logic level of an impedance setting code Ron <0> in the impedance setting code Ron <1, 0>; the logic level of an address signal A5 corresponds and is equal to the logic level of an impedance setting code Ron <1>. The mode register 22 outputs to the data input/output unit 100 an H-level (high-level) or L-level (low-level) impedance setting code Ron <0> in response to a H-level or L-level of address signal A1; and an H-level or L-level impedance setting code Ron <1> in response to a H-level or L-level of address signal A5.

When the command supplied to the control circuit 21 is an RD command, and when the memory cell array 20 is performing a read operation, the data input/output unit 100 receives data "Data" supplied from the memory cell array 20, and outputs the received data "Data" to outside via the data terminals DQ0 to DQn (Data output operation). At this time, the data input/output unit 100 controls the number of unit buffers driving the data terminals DQ0 to DQn at the time of data outputting in accordance with an impedance setting code Ron <1, 0> supplied from the mode register 22. When the command supplied to the control circuit 21 is a WT command, and when the memory cell array 20 is performing a write operation, the data input/output unit 100 supplies data "Data" input from outside via the data terminals DQ0 to DQn to the memory cell array 20.

The data input/output unit 100 is connected to the calibration terminal ZQ. The calibration terminal ZQ is connected to an impedance adjustment resistance (or external resistance RZQ) of a desired resistance value. The data input/output unit 100 adjusts the impedance of the data input/output unit 100 in accordance with the external resistance RZQ. Incidentally, impedance adjustment activation signals (control signals ACT1 and ACT2) that are supplied from the control circuit 21 to the data input/output unit 100 are used to control the execution of an impedance adjustment operation of the data input/output unit 100.

Figure 2:
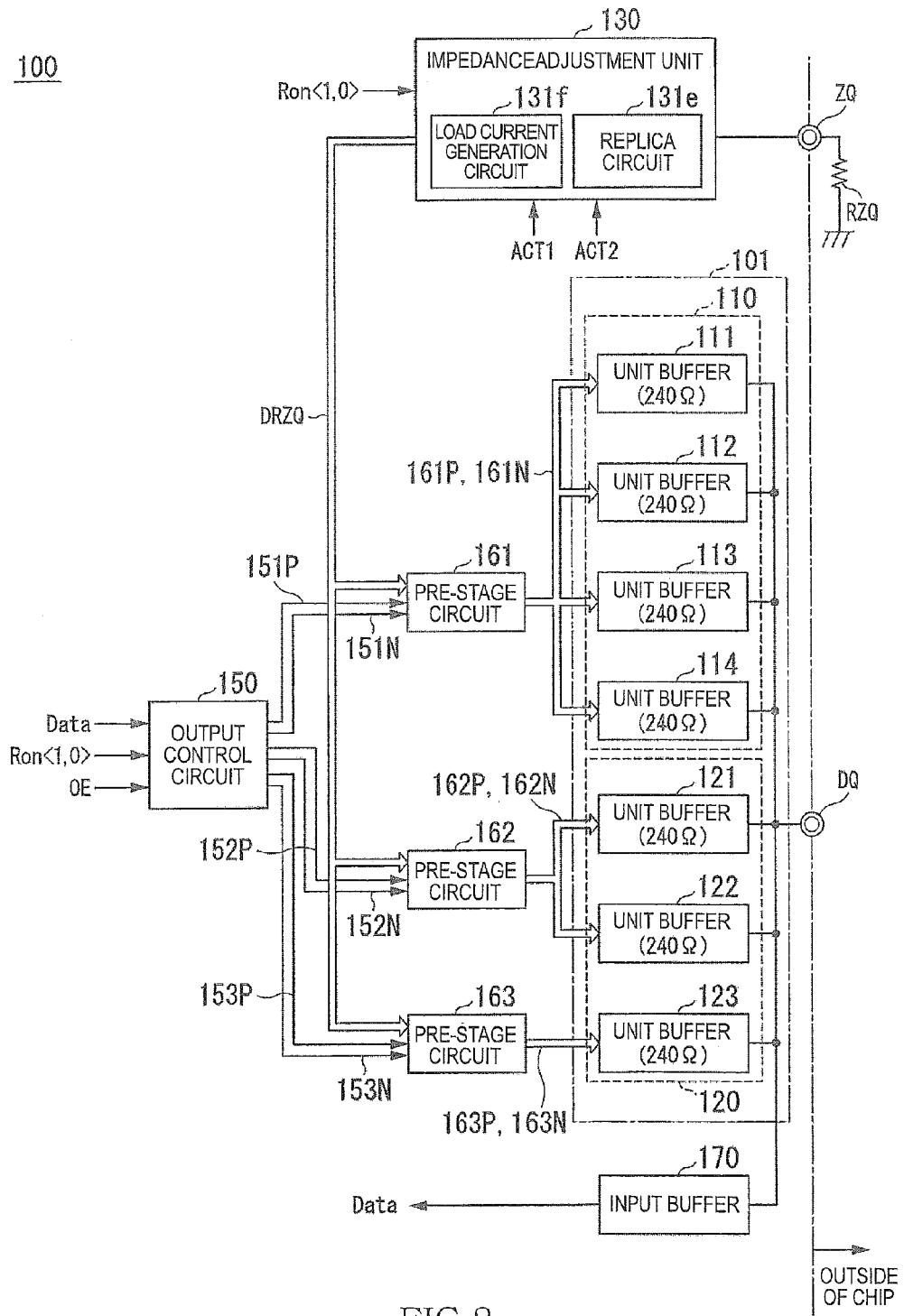
FIG. 2 is a block diagram showing configuration of the data input/output unit.

The following describes the data input/output unit 100 with reference to FIG. 2.

FIG. 2 is a block diagram showing the configuration of the data input/output unit 100. As shown in FIG. 2, the data input/output unit 100 includes a first output buffer 110 and a second output buffer 120, which are connected to a data terminal DQ; an impedance adjustment unit 130, which is connected to the calibration terminal ZQ; and an input buffer 170, which is connected to the data terminal DQ. Incidentally, the input buffer 170 is activated at a time when data are input. However, the configuration of the input buffer 170 and the details of a data input operation are not related directly to the fundamentals of the present invention, and therefore will not be described. In the present specification, suppose that an output buffer 101 of the data input/output unit 100 is made up of the first output buffer 110 and the second output buffer 120.

The first output buffer 110, which makes up the output buffer 101, includes four unit buffers 111 to 114 that are connected in parallel. The second output buffer 120, which makes up the output buffer 101, includes three unit buffers 121 to 123 that are connected in parallel. The unit buffers 111 to 114 and 121 to 123 are used to drive the data terminal DQ during a read operation, and are connected in parallel with respect to the data terminal DQ as shown in FIG. 2. The unit buffers 111 to 114 and 121 to 123 have the same circuit configuration; in one example, the impedances of all the unit buffers 111 to 114 and 121 to 123 are set to 240Ω (which is the value after adjustment) according to the present embodiment. The impedances can be adjusted by an impedance control signal DRZQ (code) generated by the impedance adjustment unit 130 during a calibration operation (described later).

Accordingly, for example, when all the unit buffers 111 to 114 and 121 to 123 are activated, the impedance (target value) of the output buffer 101 when seen from the data terminal DQ is about 34.3Ω (=240Ω/7). Moreover, for example, when the four unit buffers 111 to 114 of the first output buffer and the two unit buffers 121 and 122 of the second output buffer become activated, without activating the unit buffer 123 of the second output buffer, the impedance (target value) of the output buffer 101 when seen from the data terminal DQ is 40Ω (=240Ω/6).

However, the resistance of a power supply line to which a plurality of the unit buffers are connected in common varies depending on the number of unit buffers activated. Accordingly, the impedances of a plurality of the unit buffer circuits activated each differ from a predetermined set value (240Ω in this case), which has been adjusted during a calibration operation, at the time of data outputting or at any other time. As a result, the impedance of the output buffer 101 deviates from the target value. For example, in the case of the above example, when all the unit buffers (seven in this case) are selectively activated, the voltage of the power supply line to which the unit buffers each are connected in common is more likely to drop than when one unit buffer is selectively activated. During a calibration operation, with the use of a replica buffer equivalent to one unit buffer, the impedances of a plurality of the unit buffers each are set to 240Ω. Therefore, when seven unit buffers are selectively activated, the impedances of the unit buffers become higher than the adjusted 240Ω; as a result, the impedance of the output buffer 101 is set to a higher value than about 34.3Ω, which is the target. In this manner, depending on the number of unit buffers selectively activated, the impedances could differ from a predetermined set value (240Ω in this case), which has been adjusted in advance, at the time of data outputting or at any other time. As a result, the impedance of the output buffer 101 deviates from the target value.

Accordingly, the impedance adjustment unit 130 generates an impedance control signal DRZQ on the basis of the number of unit buffers activated, and then supplies the impedance control signal DRZQ to the output buffer 101, thereby bringing the impedance of the output buffer 101 closer to the target value.

The impedance adjustment unit 130 receives from the mode register 22 an impedance setting code Ron <1, 0> as the number of unit buffer circuits activated; generates an impedance control signal DRZQ (or an impedance adjustment signal) on the basis of the setting code; and supplies the impedance control signal DRZQ to a plurality of unit buffers (unit buffers 111 to 114 and 121 to 123) via pre-stage circuits 161 to 163, thereby adjusting the impedances of a plurality of the unit buffers.

The operation of the unit buffers 111 to 114 is controlled by operation signals 161P and 161N, which are supplied from the pre-stage circuit 161. The operation of the unit buffers 121 and 122 is controlled by operation signals 162P and 162N, which are supplied from the pre-stage circuit 162. The operation of the unit buffer 123 is controlled by operation signals 163P and 163N, which are supplied from the pre-stage circuit 163.

The pre-stage circuits 161 to 163 specify output transistors from among a plurality of output transistors (described later) contained in the corresponding unit buffers 111 to 114 and 121 to 123 to turn on. An operation of turning the output transistors ON (conductive) or OFF (non-conductive) is controlled by operation signals 161P to 163P and operation signals 161N to 163N. As shown in FIG. 2, to the pre-stage circuits 161 to 163, an impedance control signal DRZQ is supplied in common from the impedance adjustment unit 130. Moreover, from an output control circuit 150, selection signals 151P to 153P and selection signals 151N to 153N are individually supplied.

The output control circuit 150 specifies unit buffers from among a plurality of unit buffers 111 to 11n to activate, and also specifies an output level for driving the DQ terminal. The unit buffers to be activated are specified in the following manner: the output control circuit 150 receives an impedance setting code Ron <1, 0> from the mode register 22, and then outputs, on the basis of the setting code, the selection signals 151P to 153P and the selection signals 151N to 153N to the pre-stage circuits 161 to 163. The output level of a unit buffer activated is determined based on data "Data" supplied from the memory cell array 20 in the case of a read operation.

Hereinafter, the circuit blocks that make up the data input/output unit 100 each will be described in detail.

Figure 3:
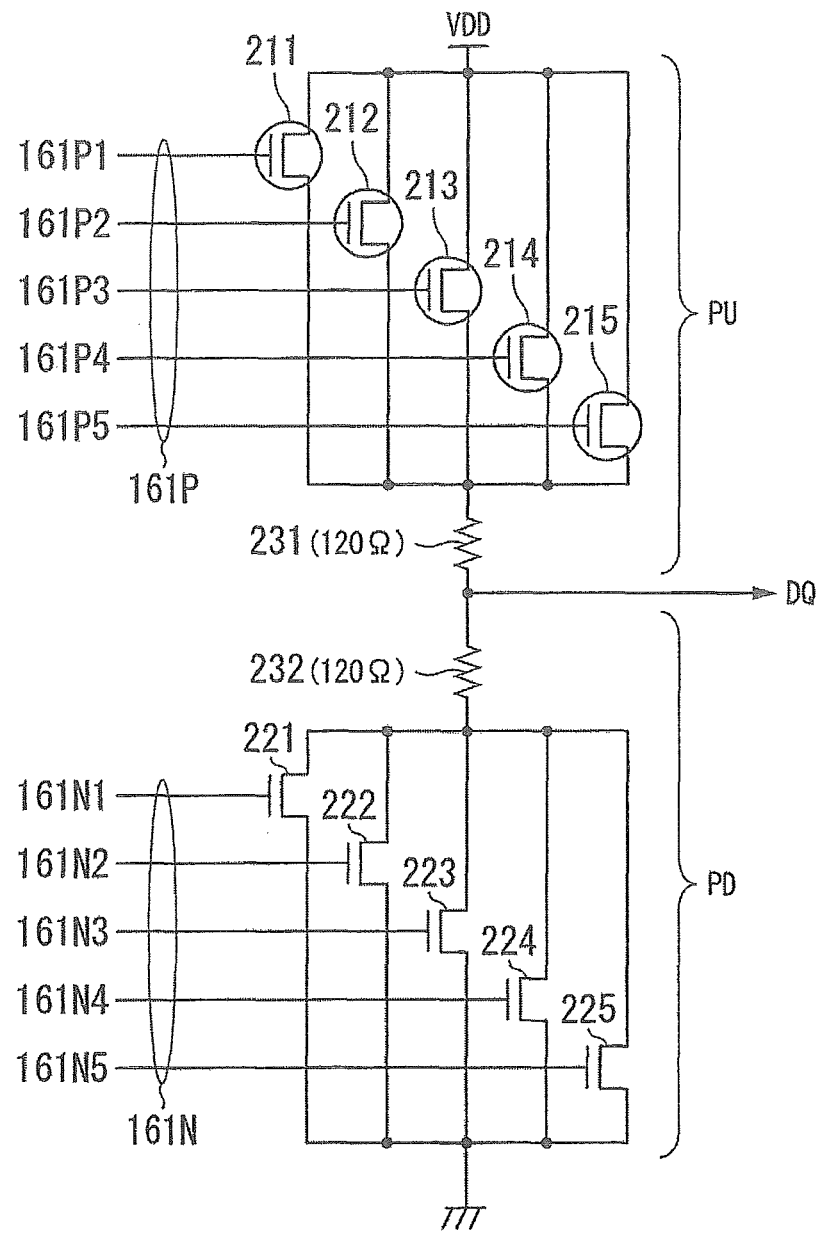
FIG. 3 is a circuit diagram of the unit buffer.

FIG. 3 is a circuit diagram of the unit buffer 111. As shown in FIG. 3, the unit buffer 111 includes plural (five in this embodiment) P-channel MOS transistors 211 to 215 connected in parallel, plural (five in this embodiment) N-channel MOS transistors 221 to 225 connected in parallel, and resistors 231 and 232 that are connected in series between the transistors 211 to 215 and the transistors 221 to 225. A contact point between the resistor 231 and the resistor 232 is connected to the data pin DQ. Of the unit buffer 111, a part including the P-channel MOS transistors 211 to 215 and the resistor 231 constitutes a pull-up circuit PU. A part including the N-channel MOS transistors 221 to 225 and the resistor 232 constitutes a pull-down circuit PD.

Five operation signals 161P1 to 161P5 that constitute the operation signal 161P are supplied respectively to the gates of the transistors 211 to 215. Five operation signals 161N1 to 161N5 that constitute the operation signal 161N are supplied respectively to the gates of the transistors 221 to 225. Based on this arrangement, the ten transistors that are included in the unit buffer 111 can be individually on/off controlled based on the ten operation signals including the operation signals 161P1 to 161P5 and the operation signals 161N1 to 161N5.

The parallel circuit including the transistors 211 to 215, and the parallel circuit including the transistors 221 to 225 are designed to have resistance of 120Ω during the conduction time. However, the on resistance of the transistors varies depending on manufacturing conditions, and also varies depending on the ambient temperature and the power supply voltage during the operation. Therefore, desired impedance is not always obtained. In order to set 120Ω to the impedance, the number of transistors to be turned on needs to be adjusted. For this purpose, the parallel circuits including plural transistors are used. In order to adjust the impedance finely and in a wide range, it is preferable to mutually differentiate a W/L ratio (a gate width to gate length ratio) of the plural transistors that constitute the parallel circuit. Preferably, weight of the power of two is used. Considering this point, according to this embodiment, when the W/L ratio of the transistor 211 is "1", the W/L ratios of the transistors 212 to 215 are set to "2", "4", "8", and "16", respectively (The values of the W/L ratios are relative values, and do not represent actual W/L ratios. This similarly applies to the following explanations).

By suitably selecting the transistors to be turned on based on the operation signals 161P1 to 161P5 and the operation signals 161N1 to 161N5, the on resistance of the parallel circuit can be fixed to substantially 120Ω, regardless of the variation due to the manufacturing conditions and a temperature change.

The resistances of the resistors 231 and 232 are set to 120Ω, respectively. With this arrangement, when at least one of the parallel circuit including the transistors 211 to 215 and the parallel circuit including the transistors 221 to 225 is in the on state, the impedance of the unit buffer 111 from the viewpoint of the data pin DQ becomes 240Ω. A tungsten (W) resistor can be used for the resistors 231 and 232.

Other unit buffers 112 to 114 that constitute the first output buffer 110 also have circuit structures that are the same as that of the unit buffer 111 shown in FIG. 3, and are controlled by the same operation signals 161P1 to 161P5 and the operation signals 161N1 to 161N5. On the other hand, other unit buffers 121 to 123 that constitute the second output buffer 120 have the same circuit structures as that of the unit buffer 111 shown in FIG. 3. However, the operations of the unit buffers 121 and 122 are controlled by the operation signals 162P and 162N, and the operation of the unit buffer 123 is controlled based on the operation signals 163P and 163N. The operation signals 162P, 162, 163P, and 163N also have five operation signals, respectively, and are used to control the corresponding pull-up circuit UP or the pull-down circuit PD.

FIG. 4 is a circuit diagram of the pre-stage circuit 161. As shown in FIG. 4, the pre-stage circuit 161 includes five OR circuits 411 to 415 and five AND circuits 421 to 425. An output control circuit 150 supplies a selection signal 151P in common to the OR circuits 411 to 415, and the impedance adjustment unit 130 supplies the impedance control signals DRZQP1 to DRZQP5 to the OR circuits 411 to 415, respectively. On the other hand, the output control circuit 150 supplies the selection signal 151N in common to the AND circuits 421 to 425, and the impedance adjustment circuit 130 supplies the impedance control signals DRZQN1 to DRZQN5 to the AND circuits 421 to 425, respectively.

The operation signals 161P1 to 161P5 that form the operation signal 161P output from the OR circuits 411 to 415, and the operation signals 161N1 to 161N5 that form the operation signal 161N output from the AND circuits 421 to 425, are supplied in common to the unit buffers 111 to 114, as shown in FIG. 2, thereby controlling the corresponding transistors.

The other pre-stage circuits 162 and 163 also have circuit configurations similar to those of the pre-stage circuit 161 shown in FIG. 4. In this case, the selection signals 152P and 152N from the output control circuit 150 are supplied in common to the OR circuit and the AND circuit respectively that are included in the pre-stage circuit 162. The selection signals 153P and 153N from the output control circuit 150 are supplied in common to the OR circuit and the AND circuit respectively that are included in the pre-stage circuit 163.

Figure 5:
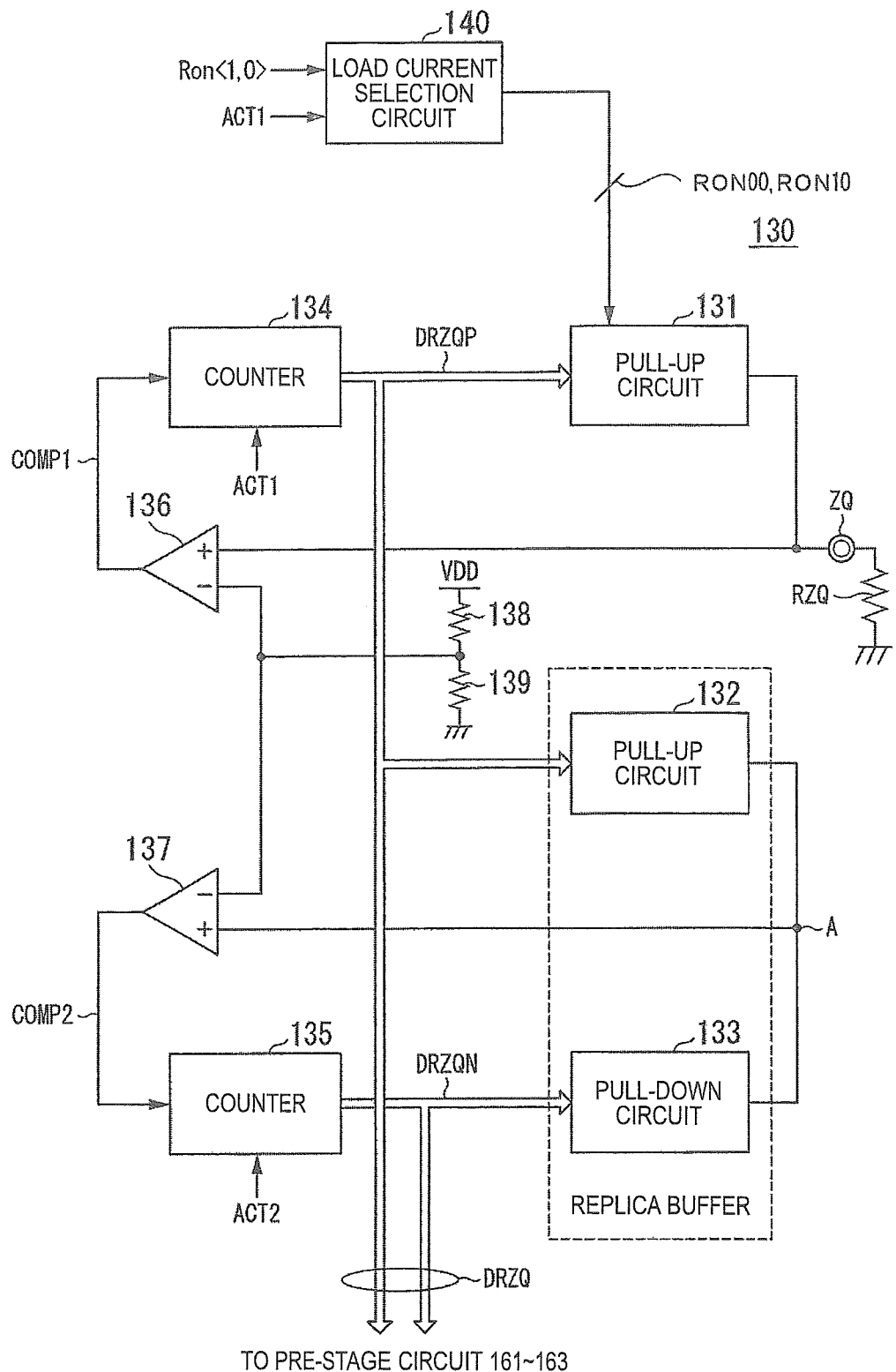
FIG. 5 is a block diagram showing configuration of the impedance adjustment circuit.

FIG. 5 is a circuit diagram of the impedance adjustment unit 130. The impedance adjustment unit 130 includes a load current selection circuit 140, pull-up circuits 131 and 132, pull-down circuit 133. The impedance adjustment circuit also includes counter 134 for controlling the pull-up circuit 134, counter 135 for controlling the pull-down circuit 133, a comparator 136 for controlling the counter 134 and a comparator 137 for controlling the counter 135.

Figure 6:
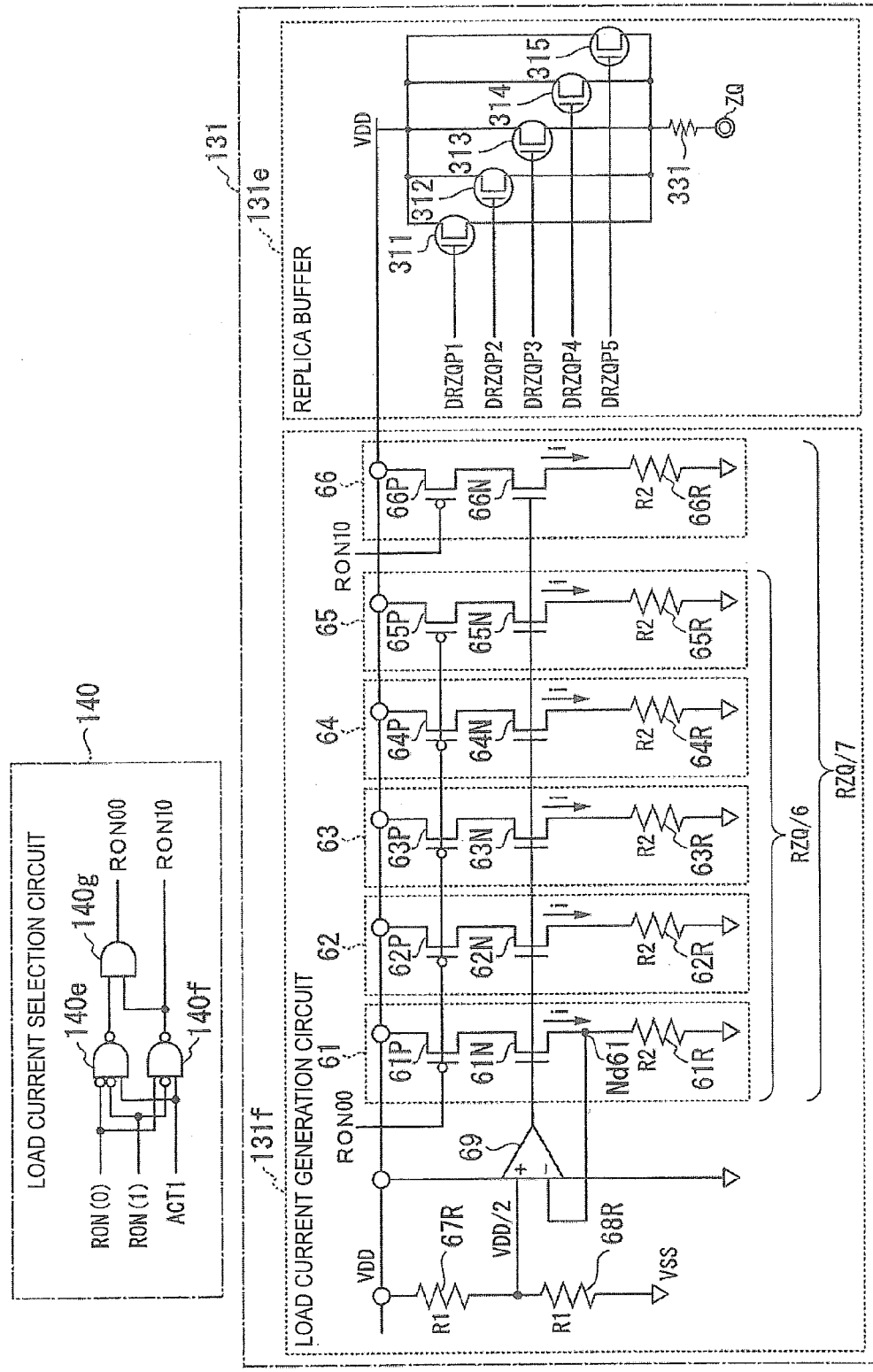
FIG. 6 is a circuit diagram of the pull-up circuit and the load current selection circuit.

FIG. 6 is a circuit diagram of the load current selection circuit 140 and the pull-up circuit 131.

The load current selection circuit 140 includes a logic circuit 140e, which is a three-input NAND circuit; a logic circuit 140f, which is a three-input NAND circuit; and an AND circuit 140g.

To the logic circuit 140e, the following signals are input: a logically inverted signal of an impedance setting code Ron (0); a logically inverted signal of an impedance setting code Ron (1); and a control signal ACT1.

To the logic circuit 140f, the following signals are input: an impedance setting code Ron (0); a logically inverted signal of an impedance setting code Ron (1); and a control signal ACT1.

The AND circuit 140g calculates a logical product of the output signal of the logic circuit 140e and the conduction control signal RON10, and then outputs a conduction control signal RON00.

That is, when the impedance setting code Ron (0) is at a L-level, the impedance setting code Ron (1) at a L-level, and the control signal ACT1 at a H-level, the load current selection circuit 140 changes the conduction control signal RON00 from a H-level to a L-level, and keeps the conduction control signal RON10 at a H-level.

When the impedance setting code Ron (0) is at a H-level, the impedance setting code Ron (1) at a L-level, and the control signal ACT1 at a H-level, the load current selection circuit 140 changes the conduction control signal RON00 from a H-level to a L-level, and changes the conduction control signal RON10 from a H-level to a L-level.

The pull-up circuit 131 includes a replica circuit 131e and a load current generation circuit 131f.

As shown in FIG. 6, the replica circuit 131e (replica circuit) has substantially the same circuit configuration as the pull-up circuits PU that the unit buffers 111 to 114 and 121 to 123 include. That is, the replica circuit 131e includes five PMOS transistors 311 to 315, which are connected in parallel; and a resistor 331, one end of which is connected to the drains of the PMOS transistors. The other end of the resistor 331 is connected to the calibration terminal ZQ.

The PMOS transistors 311 to 315 in the replica circuit 131e correspond to the PMOS transistors 211 to 215 shown in FIG. 3. The PMOS transistors 311 to 315 each have the same impedance. Therefore, as in the case of the W/L ratios of the PMOS transistors 211 to 215, the W/L ratios of the PMOS transistors 311 to 315 are set to "1," "2," "4," "8," and "16," respectively.

The resistor 331, too, corresponds to the resistor 231 shown in FIG. 3. Therefore, the resistance value thereof is set to 120Ω.

To the gates of the PMOS transistors 311 to 315, impedance control signals DRZQP1 to DRZQP5 are respectively supplied from the counter 134. As a result, the operation of the replica circuit 131e is controlled. The impedance control signals DRZQP1 to DRZQP5 correspond to the operation signals 161P1 to 161P5.

The load current generation circuit 131f includes two transistors and a resistor. The load current generation circuit 131f includes series circuits 61 to 66, which are connected to a power supply line (VDD) of the replica circuit 131e, a resistor 67R, a resistor 68R, and an operational amplifier 69.

The series circuits 61 to 66 each are formed by connecting a PMOS transistor (second transistor), a NMOS transistor (first transistor), and a resistor in series: the conduction control signal RON00 or RON10 is input into the gate of the PMOS transistor; an output signal of the operational amplifier 69 is input into the gate of the NMOS transistor.

For example, the series circuit 61 includes a PMOS transistor 61P, a NMOS transistor 61N, and a resistor 61R. The source of the PMOS transistor 61P is connected to the power supply line of the replica circuit 131e. The gate of the PMOS transistor 61P is connected to the load current selection circuit 140, and the conduction control signal RON00 is input to the gate. The drain of the PMOS transistor 61P is connected to the drain of the NMOS transistor 61N. The drain of the NMOS transistor 61N is connected to the drain of the PMOS transistor 61P. The gate of the NMOS transistor 61N is connected to the output of the operational amplifier 69. The source of the NMOS transistor 61N is connected to one end (referred to as a connection point Nd61) of the resistor 61R. One end of the resistor 61R is connected to the connection point Nd61, and the other end grounded.

Similarly, the series circuits j (j=62 to 65) each include a PMOS transistor jP, a NMOS transistor jN, and a resistor jR. The source of the PMOS transistor jP is connected to the power supply line of the replica circuit 131e. The gate of the PMOS transistor jP is connected to the load current selection circuit 140, and the conduction control signal RON00 is input to the gate. The drain of the PMOS transistor jP is connected to the drain of the NMOS transistor jN. The drain of the NMOS transistor jN is connected to the drain of the PMOS transistor jP. The gate of the NMOS transistor jN is connected to the output of the operational amplifier 69. The source of the NMOS transistor jN is connected to one end of the resistor jR. One end of the resistor jR is connected to the source of the NMOS transistor jN, and the other end grounded.

The series circuit 66 includes a PMOS transistor 66P, a NMOS transistor 66N, and a resistor 66R. The source of the PMOS transistor 66P is connected to the power supply line of the replica circuit 131e. The gate of the PMOS transistor 66P is connected to the load current selection circuit 140, and the conduction control signal RON10 is input to the gate. The drain of the PMOS transistor 66P is connected to the drain of the NMOS transistor 66N. The drain of the NMOS transistor 66N is connected to the drain of the PMOS transistor 66P. The gate of the NMOS transistor 66N is connected to the output of the operational amplifier 69. The source of the NMOS transistor 66N is connected to one end of the resistor 66R. One end of the resistor 66R is connected to the source of the NMOS transistor 66N, and the other end grounded.

The resistor 67R (of resistance value R1) and the resistor 68R (of resistance value R1) make up a voltage-dividing circuit. The voltage-dividing circuit outputs a reference voltage of (VDD/2) to an non-inverting input terminal (+) of the operational amplifier 69.

Meanwhile, the inverting input terminal (−) of the operational amplifier 69 is connected to the connection point Nd61 of the series circuit 61. The operational amplifier 69 adjusts the voltage level of the output signal thereof in response to the voltage levels of the two input terminals and outputs the output signal to the gates of the NMOS transistors 61N to 66N of the series circuits 61 to 66.

When the voltage level of the connection point Nd61 is lower than the reference voltage (VDD/2), the operational amplifier 69 raises the voltage level of the output signal so that a current driving capability of each of the NMOS transistors 61N to 66N increases. When the voltage level of the connection point Nd61 is higher than the reference voltage (VDD/2), the operational amplifier 69 lowers the voltage level of the output signal so that the current driving capability of each of the NMOS transistors 61N to 66N decreases.

In this manner, the resistance value R2 of the resistor 61R of the series circuit 61 is set to the same value as the external resistance RZQ. Therefore, the value of the current flowing through the resistor 61R (indicated by i in the diagram) can be substantially equal to the value of the current that flows through the external resistance RZQ at a time when the voltage level of the calibration terminal ZQ is (VDD/2). During a calibration operation, to the replica circuit 131e, impedance control signals DRZQP (DRZQP1 to DRZQP5) are input; the impedance control signals DRZQP are adjusted in such a way that the voltage level of the calibration terminal ZQ comes to (VDD/2). In the resistor 61R, the operational amplifier 69 operates to adjust the current driving capability of the NMOS transistor 61N, thereby bringing the voltage level of one end of the resistor 61R to (VDD/2). As a result, the value i of the current flowing through the resistor 61R is substantially equal to the current value of the external resistance RZQ.

In that manner, in the series circuit 61, the PMOS transistor 61P is turned ON during the calibration operation. Therefore, the current whose current value i is substantially equal to that of the current flowing from the power supply line of the replica circuit 131e to the ground via the external resistance RZQ connected to the calibration terminal ZQ flows through the series circuit 61. In this manner, the voltage level of the power supply line of the replica circuit 131e is decreased.

The resistance values of the resistors in the other series circuits are set to the same resistance value R2 of the series circuit 61.

That is, during the calibration operation, a L-level conduction control signal RON00 is output from the load current selection circuit 140 to the load current generation circuit 131f, thereby operating five series circuits 61 to 65 in total. Therefore, when the six unit buffers shown in FIG. 2, or the unit buffers 111 to 114 and 121 to 122, are activated in total, it is possible to cause a drop in the voltage level of the power supply line of the replica circuit 131e that is akin in magnitude to a drop in the voltage level of the power supply line to which the above unit buffers are connected.

Moreover, the L-level conduction control signal RON00 and the L-level conduction control signal RON10 are output from the load current selection circuit 140 to the load current generation circuit 131f, thereby operating six series circuits 61 to 66 in total. Therefore, when the seven unit buffers shown in FIG. 2, or the unit buffers 111 to 114 and 121 to 122 and 123, are activated in total, it is possible to cause a drop in the voltage level of the power supply line of the replica circuit 131e that is substantially equal in voltage level to a drop in the voltage level of the power supply line to which the above unit buffers are connected.

In that manner, the load current generation circuit 131f changes, during the calibration operation, the current flowing therethrough depending on the number of unit buffers activated during the data outputting, thereby causing a voltage drop on the power supply line of the replica circuit 131e that is substantially equal in voltage level to a drop in the voltage level of the power supply line to which the activated unit buffers are connected. Therefore, the impedance control signals DRZQ, which are determined during the calibration operation, can be adjusted in such a way as to reflect the number of unit buffers activated.

Incidentally, when the unit buffers and a power supply line to which the unit buffers are connected are arranged substantially same layout configuration to the load current generation circuit 131f, the replica circuit 131e, and a power supply line to which the load current generation circuit 131f and the replica circuit 131e are connected, the resistance value R2 may be set equal to the resistance value of the resistance RZQ as described above. However, when the layout configurations of both are different, the resistance value R2 may be set to a different value than the resistance value of the resistance RZQ by running a circuit simulation in such a way as to reflect each layout configuration.

Figure 7A:
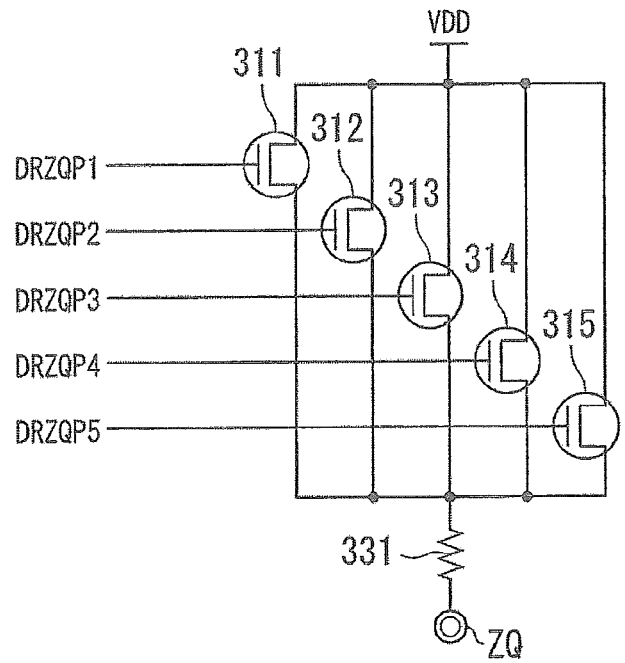
FIGS. 7A-7B are circuit diagrams of the pull-up circuit and pull-down circuit.
Figure 7B:
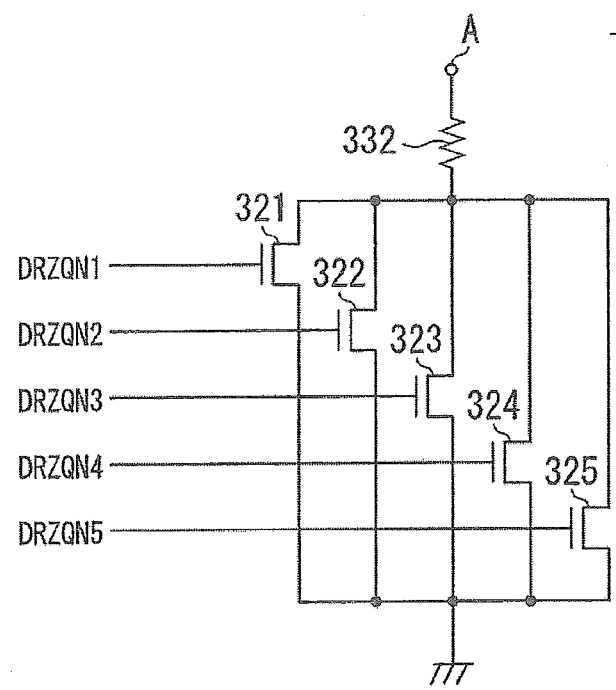

FIGS. 7A-7B are circuit diagrams of the pull-up circuit 132 and the pull-down circuit 133, respectively.

As shown in FIG. 7A, the pull-up circuit 132 has a circuit structure substantially the same as that of the pull-up circuit PU in FIG. 3. The gates of five PMOS transistors in the pull-up circuit 132 is supplied with the impedance control signals DRZQP1 to DRZQP5.

As shown in FIG. 7B, the pull-down circuit 133 has a circuit structure substantially the same as that of the pull-down circuit PD included in the unit buffers 111 to 114 and 121 to 123, respectively. In other words, the pull-down circuit 132 includes five N-channel MOS transistors 321 to 325 that are connected in parallel, and a resistor 332 of which one end is connected to drains of these transistors. The transistors 321 to 325 included in the pull-down circuit 133 correspond to the transistors 221 to 225 shown in FIG. 3, and have the same impedance, respectively. The configuration of the pull-down circuit 133 is similar to that of the pull-up circuit 131, in this respect. The resistor 332 also corresponds to the resistor 232 shown in FIG. 3. Therefore, resistance of the resistor 332 is also set to 120 Ω.

The counter 135 supplies impedance control signals DRZQN1 to DRZQN5 to the gates of the transistors 321 to 325, respectively, thereby controlling the pull-down circuit 133. The impedance control signals DRZQN1 to DRZQN5 correspond to the operation signals 161N1 to 161N5.

As explained above, the replica circuit 131e of the pull-up circuit 131 and the pull-up circuit 132 have substantially the same circuit structures as that of the pull-up circuit PU included in the unit buffers 111 to 114 and 121 to 123, respectively. The pull-down circuit 133 has substantially the same circuit structure as that of the pull-down circuit PD included in the unit buffers 111 to 114 and 121 to 123, respectively. The impedances of these replica circuits 131e, 132, the pull-down circuit 133 are adjusted in accordance with the number of activated unit buffers during the calibration process.

Returning to FIG. 5, a non-inverted input terminal (+) of the comparator 137 is connected to a contact node A at which the pull-up circuit 132 and the pull-down circuit 133 are connected to each other.

The counter 134 counts up or counts down when a control signal ACT1 is activated. When a comparison signal COMP1 that is output from the comparator 136 is at a high level, the counter 134 continues counting up, and when the signal COMP1 is at a low level, the counter 134 continues counting down. A noninverted input terminal (+) of the comparator 136 is connected to the calibration pin ZQ, and a noninverted input terminal (−) is connected to an intermediate point between the resistors 138 and 139 that is connected to a power supply potential (VDD) and a ground potential (GND). Based on this structure, the comparator 136 compares the potential of the calibration pin ZQ with the intermediate voltage (VDD/2). When the former potential is higher, the output comparison signal COMP1 is set to a high level. When the latter potential is higher, the comparison signal COMP1 is set to a low level.

On the other hand, the counter 135 counts up or counts down when a control signal ACT2 is activated. When a comparison signal COMP2 that is output from the comparator 137 is at a high level, the counter 135 continues counting up, and when the signal COMP2 is at a low level, the counter 135 continues counting down. A non-inverted input terminal (+) of the comparator 137 is connected to a contact node A as the output end of the replica buffer, and a non-inverted input terminal (−) is connected to an intermediate point between the resistors 138 and 139. Based on this structure, the comparator 137 compares the output potential of the replica buffer with the intermediate voltage (VDD/2). When the former potential is higher, the output comparison signal COMP2 is set to a high level. When the latter potential is higher, the comparison signal COMP2 is set to a low level.

When the control signals ACT1 and ACT2 are inactivated, the counters 134 and 135 stop the count operation, and hold the current count value. As described above, the count value of the counter 134 is used for the impedance control signal DRZQP, and the count value of the counter 135 is used for the impedance control signal DRZQN. The collective impedance control signal DRZQ, which is adjusted based on the number of activated unit buffers by the load current generation circuit 131$f$ in the calibration process, is supplied in common to the pre-stage circuits 161 to 163 shown in FIGS. 2 and 4.

The described above is the configuration of the data input/output unit 100 of the present embodiment. The operation of the data input/output unit 100 will be described especially in calibration and data output operations in series with reference to the FIGS. 8 and 9.

Figure 8:
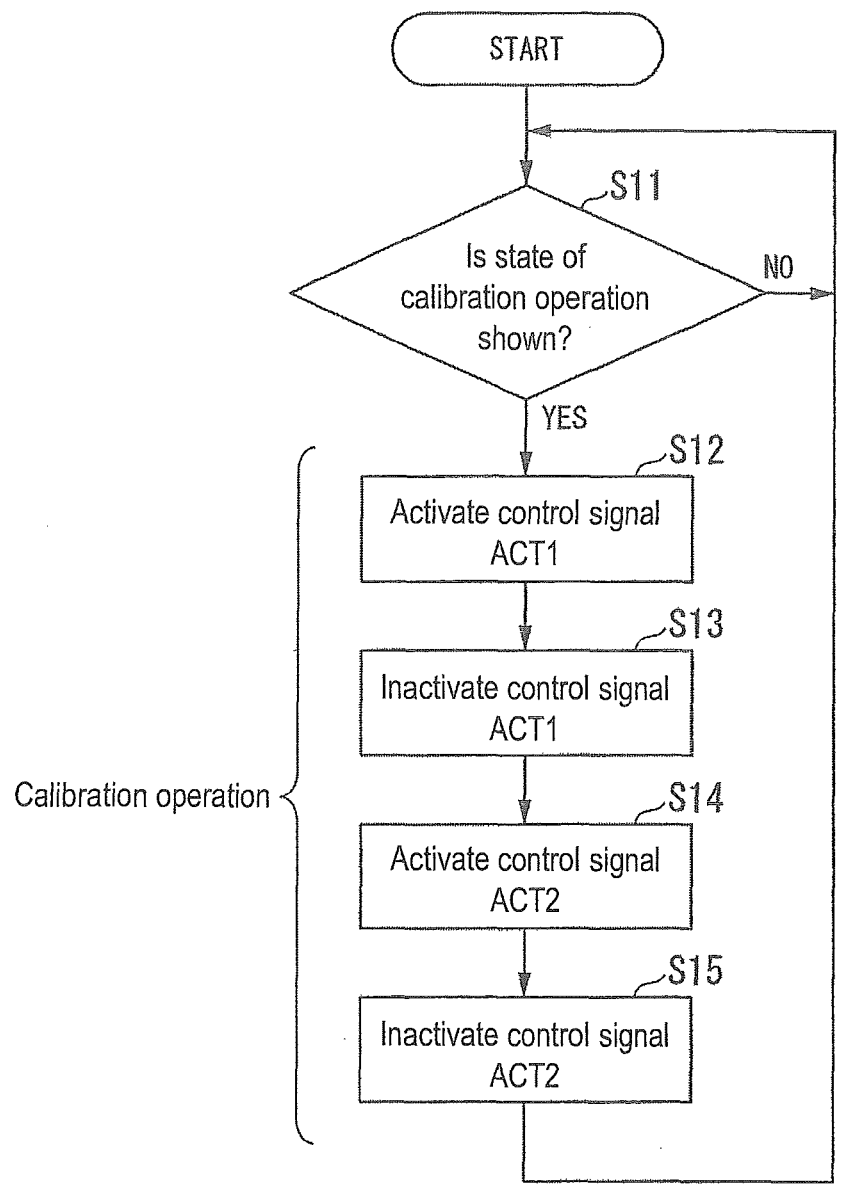
FIG. 8 is a flowchart for explaining calibration process.
Figure 9A:
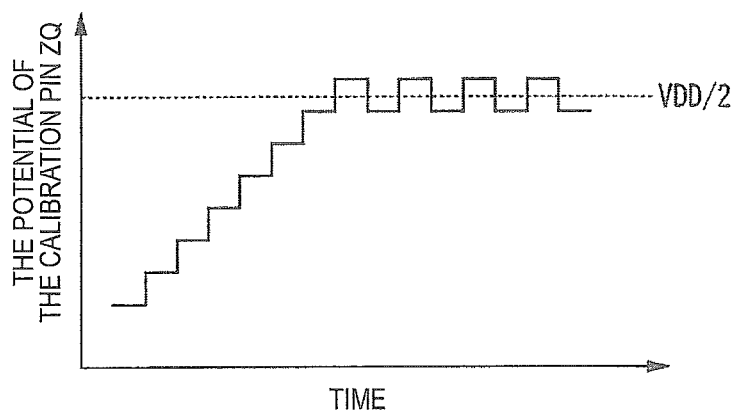
FIGS. 9A-9B are graphs showing potential transitions at the calibration terminal ZQ and contact A during calibration.

FIG. 8 is a flowchart for explaining the calibration operation. FIG. 9 is a graph showing a change of potential at the calibration pin ZQ, contact node A during the calibration operation;

[Calibration Operation]

The calibration operation is for adjusting the impedance of the output buffers 101, as described above. The calibration operation is carried out to correct variations of the impedance due to process conditions at the manufacturing time, and to correct changes of the impedance due to changes in the ambient temperature and variations in the power supply voltage. Therefore, when high precision is required, it is preferable to periodically execute the calibration operation during the actual operation, instead of carrying out the calibration operation only once at the power up time or the initialization time such as the resetting time. The output circuit 100 according to this embodiment is particularly effective when the calibration operation is periodically executed during the actual operation as explained above. The calibration operation is explained in detail below.

In executing the calibration operation, first, the external resistor RZQ needs to be connected to the calibration pin ZQ (see FIG. 2 and FIG. 5). The external resistor RZQ needs to have impedance that is the same as the impedance (i.e., the impedance of a replica buffer) required for the unit buffers 111 to 114 and 121 to 123. Therefore, in this embodiment, the external resistor RZQ having 240Ω is used.

Moreover, suppose that, before a calibration command (CAL command) is supplied to the semiconductor device 10 as a command signal CMD to instruct the semiconductor device 10 to perform a calibration operation, a mode register command (MRS command) is supplied to the semiconductor device 10 as a command signal CMD. Furthermore, suppose that, to the semiconductor device 10, together with the MRS command, a mode setting code (or a DS setting code=[0, 1] including a code [A5, A1]) is supplied as an address signal ADD through the address terminals 13; and that the mode register 22 keeps the impedance setting code Ron <0> at a H-level in the impedance setting code Ron <1, 0> while changing the impedance setting code Ron <1> from a H-level to a L-level, and outputs each code to the data input/output unit 100.

First, when the calibration operation is instructed by a CAL command (step S11: YES), the control signal ACT1 is activated, and the counter 134 included in the impedance adjustment unit 130 starts a count operation (step S12). In the initialization state before the control signal ACT1 is activated, the count value of the counter 134 is all reset to 1 ("5'b11111" in this example). Therefore, the inductance control signals DRZQP1 to DRZQP5 are all at the high level. Consequently, the transistors 311 to 315 that are included in the replica circuit 131$e$ in the pull-up circuit 131 are all in the off state. As a result, the comparison signal COMP1 that is the output of the comparator 136 is at the low level.

Therefore, the counter 134 continues counting down. The on/off state of the transistors 311 to 315 is switched over linked to the count-down. Specifically, because the W/L ratios of the transistors 311 to 315 are set to "1", "2", "4", "8", and "16", respectively, the least significant bit (LSB) of the counter 134 is allocated to the impedance control signal DRZQP 1, and the most significant bit (MSB) of the counter 134 is allocated to the impedance control signal DRZQP5. With this arrangement, the impedance of the pull-up circuit 131 can be changed at a minimum pitch.

The load current selection circuit 140 brings both the conduction control signals RON00 and RON10 to a L-level in accordance with the impedance setting code Ron <1, 0>. As a result, all the series circuits 61 to 66 of the load current generation circuit 131$f$ operate, thereby decreasing the voltage level of the power supply line that supplies power to the replica circuit 131$e$ in accordance with the number of unit buffers activated (seven in this case) along with the replica circuit 131$e$.

When the count-down continues, the impedance of the replica circuit 131$e$ gradually decreases, and the potential of the calibration pin ZQ gradually increases. When the impedance of the replica circuit 131$e$ decreases to less than the target impedance 240Ω, the potential of the calibration pin ZQ exceeds the intermediate voltage (VDD/2). Therefore, the comparison signal COMP1 that is output from the comparator 136 is inverted to a high level. In response to this, the counter 134 continues counting up, thereby increasing the impedance of the pull-up circuit 131$e$ this time.

By repeating this operation, the potential of the calibration pin ZQ is stabilized near the intermediate voltage (VDD/2). Thereafter, the control signal ACT1 is inactivated, thereby stopping the count operation of the counter 134 (step S13). The load current selection circuit 140 high-activates connection control signals RON 00 and RON 10, PMOS transistor (second transistor) is set to off in any of DC circuits 61 to 66 in the load current generation circuit 131$f$ and the load current generation circuit 131$f$ is electrically cut off from the lines of the replica circuit 131$e$. As a result, the count value of the counter 134 is fixed, and the levels of the impedance control signals DRZQP1 to DRZQP5 are firmed.

Based on the above operation, the impedances of the replica circuit 131$e$ and pull-up circuit 132 are adjusted in accordance with the number of activated unit buffers. In this case, the initial value of the counter 134 can be a set value of 240Ω, instead of all one, and this value can be adjusted by counting up or counting down according to the level of the comparison signal COMP1.

The control signal ACT2 is then activated, thereby starting the count operation of the counter 135 included in the impedance adjustment unit 130 (step S14). In the initial state before the control signal ACT1 is activated, the count value of the counter 135 is reset to all zero ("5'b00000" in this example), as an example. Therefore, the impedance control signals DRZQP1 to DRZQP5 that are output from the counter 135 are all at the low level. Consequently, the transistors 321 to 325 included in the pull-down circuit 133 are all in the off state. As a result, the comparison signal COMP2 that is output from the comparator 137 becomes at a high level.

In response to this, the counter 135 continues the count up. The on/off state of the transistors 321 to 325 is switched over linked to this count up. In this case, the W/L ratios of the transistors 321 to 325 are set to "1", "2", "4", "8", and "16", respectively. Corresponding to these W/L ratios, the least significant bit (LSB) of the counter 135 is allocated to the impedance control signal DRZQN1, and the most significant bit (MSB) of the counter 135 is allocated to the impedance control signal DRZQN5. With this arrangement, the impedance of the pull-down circuit 133 can be changed at a minimum pitch.

Figure 9B:
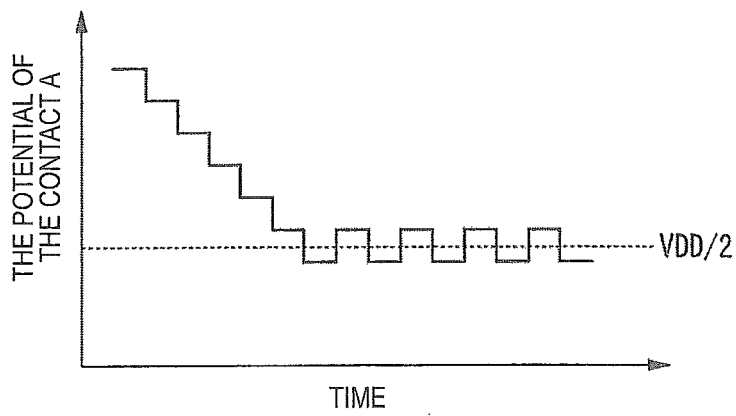

When the count up continues, the impedance of the pull-down circuit 133 gradually decreases, and as shown in FIG. 9B, the potential of the node A gradually decreases. When the impedance of the pull-down circuit 133 decreases to less than the target impedance 240Ω, the potential of the node A becomes lower than the intermediate voltage (VDD/2). Therefore, the comparison signal COMP2 that is output from the comparator 137 is inverted to a low level. In response to this, the counter 135 continues the count-down, thereby increasing the impedance of the pull-down circuit 133 this time.

By repeating this operation, the potential of the contact node A is stabilized near the intermediate voltage (VDD/2). Thereafter, the control signal ACT2 is inactivated, thereby stopping the count operation of the counter 135 (step S15). As a result, the count value of the counter 135 is fixed, and the levels of the impedance control signals DRZQN1 to DRZQN5 are firmed. Based on the above operation, the impedance of the pull-down circuit 133 is also adjusted in accordance with the number of unit buffers same as the replica circuit 131e and pull-up circuit 132. In this case, the initial value of the counter 135 can be a set value of 240Ω, instead of all zero, and this value can be adjusted by counting up or counting down according to the level of the comparison signal COMP2.

The process returns to step S11, and the instruction for the calibration operation based on a CAL command is awaited. When the calibration operation is instructed (step S11: YES), the above series of operation is carried out again.

The above is the calibration operation. The impedance control signal DRZQ that is firmed by the calibration operation is supplied in common to the pre-stage circuits 161 to 163 shown in FIGS. 2 and 4. Therefore, the unit buffers 111 to 114 and 121 to 123 that are controlled by the pre-stage circuits 161 to 163 can also operate accurately in the impedance which is adjusted in accordance with the number of activated unit buffers. In other words, the plurality of unit buffers can be collectively calibrated.

When a DS setting code [00], along with the MRS command, is supplied to the semiconductor device 10 before a CAL command is supplied to instruct the semiconductor device 10 to perform a calibration operation, the mode register 22 changes the impedance setting code Ron<0> from a H-level to a Low-level, and the impedance setting code Ron<1> from a H-level to a Low-level, and outputs each of the codes to the data input/output unit 100. In this case, during a period of time when the control signal ACT1 is at an activity level, the load current selection circuit 140 changes the conduction control signal RON00 to a L-level and the conduction control signal RON10 to a H-level in accordance with the impedance setting code Ron<1, 0>. As a result, the series circuits 61 to 65 of the load current generation circuit 131f operate. Together with the replica circuit 131e, the load current generation circuit 131f decreases the voltage level of the power supply line that supplies power to the replica circuit 131e in accordance with the number of unit buffers activated (six in this case). Therefore, the unit buffers 111 to 114 and 121 to 122, which are controlled by the pre-stage circuits 161 to 163, are able to operate after the impedances of the unit buffers 111 to 114 and 121 to 122 are adjusted in accordance with the number of unit buffers activated (six in this case).

[Data Output Operation]

The following describes a data output operation.

After a read command is supplied from a memory controller, the output control circuit 150 activates one or ones of the unit buffers 111 to 114 and 121 to 123 of the output buffer 101. The number of activated unit buffers is designated by a DS setting code supplied from the mode register 22. The activated unit buffers, or the one or ones of the unit buffers, drive a corresponding data terminal DQ to a logic level corresponding to "Data" supplied from the memory cell array 20. In this case, one of the pull-up circuit PU and pull-down circuit PD of each of the activated unit buffers drives the corresponding data terminal with the impedance based on an impedance control signal DRZQ supplied from the impedance adjustment unit 130.

Incidentally, the data output operation needs to be performed after the above-described calibration operation is carried out at least once, thereby ensuring that the operation is carried out with the correct impedance.

As described above, the semiconductor device 10 includes an output circuit (output buffer 101), which includes a plurality of unit buffer circuits whose impedances each are adjustable; a control circuit (output control circuit 150), which selectively activates one or ones of the unit buffer circuits; and an impedance adjustment unit (impedance adjustment unit 130), which is an impedance adjustment unit that adjusts the impedances of the plurality of unit buffer circuits, and which includes a replica circuit (replica circuit 131e) that has the replica impedance that is substantially equal to impedance of each of the unit buffer circuits, and a load current generation circuit (load current generation circuit 131f) that is connected in parallel to the replica circuit and changes the quantity of current flowing therethrough in accordance with the number of unit buffer circuits selectively activated by the control circuit.

Therefore, the impedance of the replica circuit 131e is adjusted according to the number of unit buffer circuits selectively activated. The impedance adjustment result of the replica circuit is reflected in the process of adjusting the impedances of unit buffer circuits that make up the output buffer 101 (output circuit). As a result, the number of the unit buffer circuits is reflected in the process of adjusting the impedance of the output circuit. Therefore, it is possible to improve the accuracy of adjusting the impedance of the output circuit.

Hereinafter, as for suppression of the impedance deviation ΔRon (Ron deviation) of the output buffer 101 that is attributable to the number of unit buffer circuits activated, the advantageous effects achieved by the present invention will be described based on experimental results.

FIGS. 10A-10B and 11A-11C are diagrams illustrating the impedance deviation ΔRon relative to the number of unit buffer circuits.

In the cases of FIG. 10A and FIGS. 11A-11C, the present invention is not applied; FIG. 10A and FIGS. 11A-11C show the impedance deviation ΔRon at a time when one, two, four, or seven unit buffers in the output buffer 101 are activated. In the case of FIG. 10B, the present invention is applied; FIG. 10B shows the impedance deviation ΔRon at a time when one or seven unit buffers in the output buffer 101 are activated.

Incidentally, in FIGS. 10A, 10B, 11A, 11B and 11C, the relationship between the impedance control signals DRZQ (ZQ adjustment codes) and the impedance deviation ΔRon of the replica circuit 131e that is adjusted by the ZQ adjustment codes is plotted by symbol "square shape".

In FIGS. 10A, 10B, 11A, 11B and 11C, the impedance deviation ΔRon of the output buffer 101 (which corresponds to the DQ circuit (RZQ/1) in the diagrams) at a time when one unit buffer is activated is plotted by symbol "(black) triangle shape"; the impedance deviation ΔRon of the output buffer 101 (which corresponds to the DQ circuit (RZQ/7) or the like in the diagrams) at a time when a plurality of unit buffers are activated is plotted by symbol "rhombus shape".

According to the present embodiment, the impedance deviation ΔRon of the replica circuit 131*e* represents the following in percentage: (the impedance value of the replica circuit 131*e*−240Ω)/240Ω. The impedance deviation ΔRon of the output buffer 101 represents the following in percentage: (the impedance of the output buffer 101−240 Ω/the number of unit buffers activated)/(240 Ω/the number of unit buffers activated). Incidentally, "(240Ω/the number of unit buffers activated)" turns out to be a target impedance of the output buffer 101 after a calibration operation, i.e. after the impedance is adjusted by a ZQ adjustment code.

According to the present embodiment, the impedance of the replica circuit 131*e* is adjusted to 240Ω. Therefore, as shown in FIGS. 10A, 10B, 11A, 11B and 11C, when the ZQ adjustment code=15 (="5'b01111"="0Fh"), the impedance deviation ΔRon of the replica circuit 131*e* is substantially 0%. Incidentally, the impedance of the replica circuit 131*e* decreases as the value of the ZQ adjustment code becomes larger; the impedance deviation ΔRon grows toward the (−) side as a result. The impedance of the replica circuit 131*e* increases as the value of the ZQ adjustment code becomes smaller; the impedance deviation ΔRon grows toward the (+) side as a result.

Figure 10A:
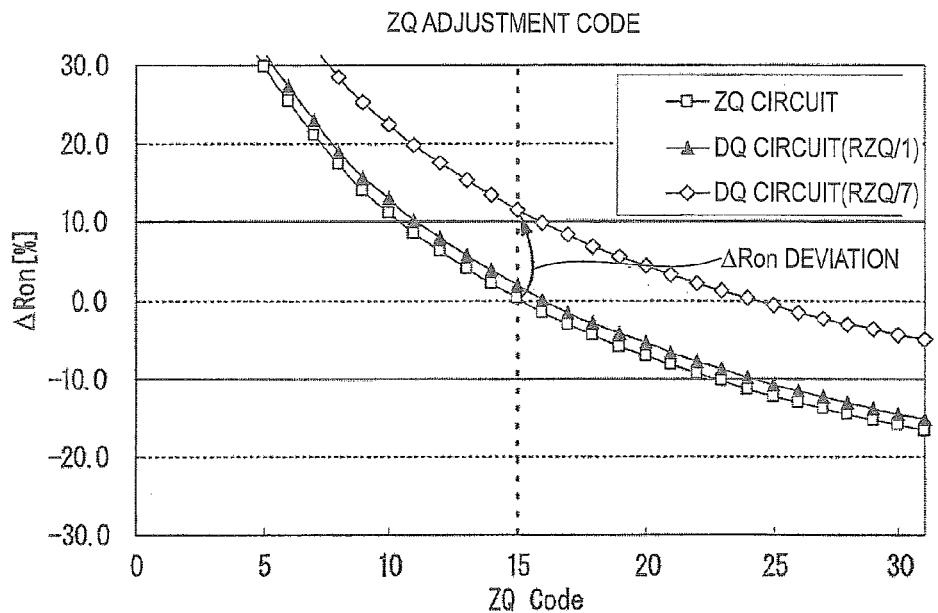
FIGS. 10A-10B are diagrams for explaining Ron deviation of the output buffer based on the number of unit buffers.
Figure 10B:
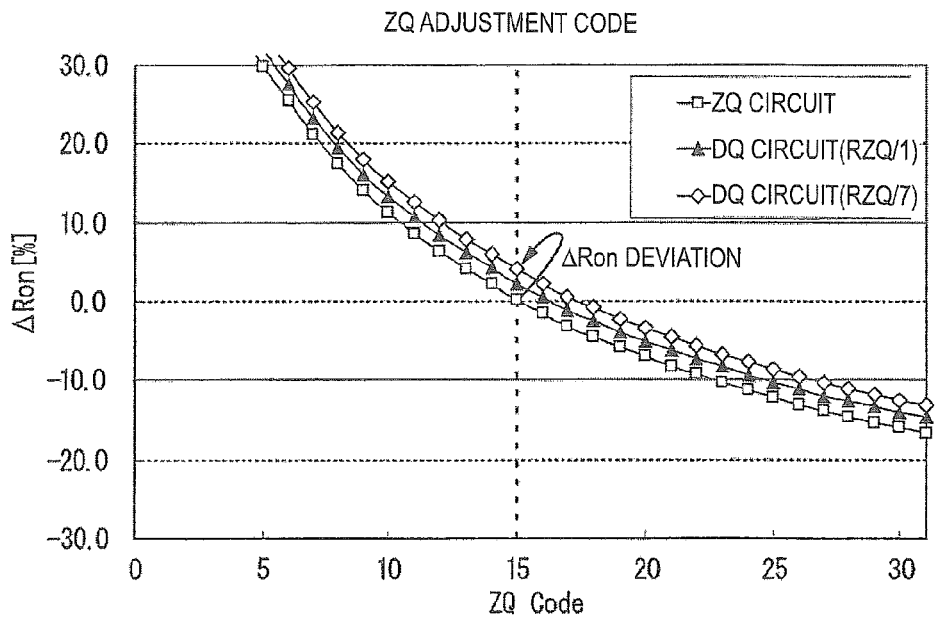

As shown in FIGS. 10A and 10B, when one unit buffer in the output buffer 101 becomes activated, the impedance deviation ΔRon of the output buffer 101 is substantially equal to the impedance deviation ΔRon of the replica circuit 131*e*. The reason is as follows: During the calibration operation, one unit buffer is activated in the output buffer 101, and a voltage drop that occurs on the power supply line of the output buffer 101 is therefore substantially equal to a voltage drop that occurs on the power supply line of the replica circuit 131*e*.

However, when the present invention is not applied, as shown in FIG. 10A, the impedance deviation ΔRon of the output buffer 101 at a time when seven unit buffers in the output buffer 101 become activated differs significantly from the impedance deviation ΔRon of the replica circuit 131*e*: For example, when the ZQ adjustment code=15, the impedance deviates toward the (+) side by about 10%. The reason is as follows: During the calibration operation, seven unit buffer are activated in the output buffer 101, and a voltage drop that occurs on the power supply line of the output buffer 101 is therefore larger than a voltage drop that occurs on the power supply line of the replica circuit 131*e*.

As the present invention is applied, as shown in FIG. 10B, there is a great improvement in the impedance deviation ΔRon of the output buffer 101 at a time when seven unit buffers in the output buffer 101 become activated, compared with the case where the present invention is not applied: For example, when the ZQ adjustment code=15, there is an improvement to such a degree that the impedance deviates toward the (+) side by about 4%. The reason is as follows: During the calibration operation, the load current generation circuit 131*f* causes a voltage drop on the power supply line of the replica circuit 131*e* in accordance with the number of unit buffers activated in the output buffer 101, and a voltage drop that occurs on the power supply line of the output buffer 101 is therefore substantially equal to a voltage drop that occurs on the power supply line of the replica circuit 131*e*.

That is, according to the present invention, the number of unit buffer circuits activated is reflected in the process of adjusting the impedance of the output circuit, thereby improving the accuracy of adjusting the impedance of the output circuit.

Incidentally, as shown in FIGS. 11A to 11C, as the number of unit buffers activated in the output buffer 101 increases, the percentage of the impedance deviation ΔRon of the output buffer 101 becomes larger. For example, the following takes a look at the percentage of the impedance deviation ΔRon of the output buffer 101 when the external resistance RZQ=240Ω, and when the product specifications (Spec) are ±10%.

The 10% deviation from Spec at RZQ/1 means 240Ω× 10%=24Ω. The 10% deviation from Spec at RZQ/2 means 240Ω×(½)×10%=12Ω. The 10% deviation from Spec at RZQ/4 means 240Ω×(¼)×10%=6Ω. The 10% deviation from Spec at RZQ/7 means 240Ω×(⅐)×10%=3.4Ω.

That is, when the amount of deviation is similarly about 3Ω, there is not much impact in the case of RZQ/1 because the percentage of the deviation is as follows: (3/24)×10%=1.3%. However, in the case of RZQ/7, there is a great impact because the percentage of the deviation is as follows: (3/3,4)×10%=8.8%.

According to the present embodiment, what is described as an example is the process of adjusting the impedance of the replica circuit 131*e*, aimed at the situation (RZQ/6, RZQ/7) where the number of unit buffers is increased, or the situation where the percentage of the impedance deviation ΔRon of the output buffer 101 is large.

As described above, even if Code (impedance control signal DRZQ) that has been adjusted for a large number of unit buffers is used in the situation (RZQ/2, RZQ/4) where the number of unit buffers is small, the percentage of the impedance deviation ΔRon of the output buffer 101 is small as described above in the situation where the number of DC buffers is small, thereby having almost no impact. Therefore, according to the present invention, while keeping the percentage of the impedance deviation ΔRon of the output buffer 101 substantially at a conventional level in the situation where the number of unit buffers activated in the output buffer 101 is small, it is possible to make an improvement in the percentage of the impedance deviation ΔRon of the output buffer 101 in the situation where the number of unit buffers activated in the output buffer 101 is large, i.e. the situation where the percentage of the impedance deviation ΔRon of the output buffer 101 is remarkable.

The load current generation circuit 131*f* in the pull-up circuit 131 is not limited to the above-described circuit configuration, and may have the circuit configuration described below, for example.

Figure 12:
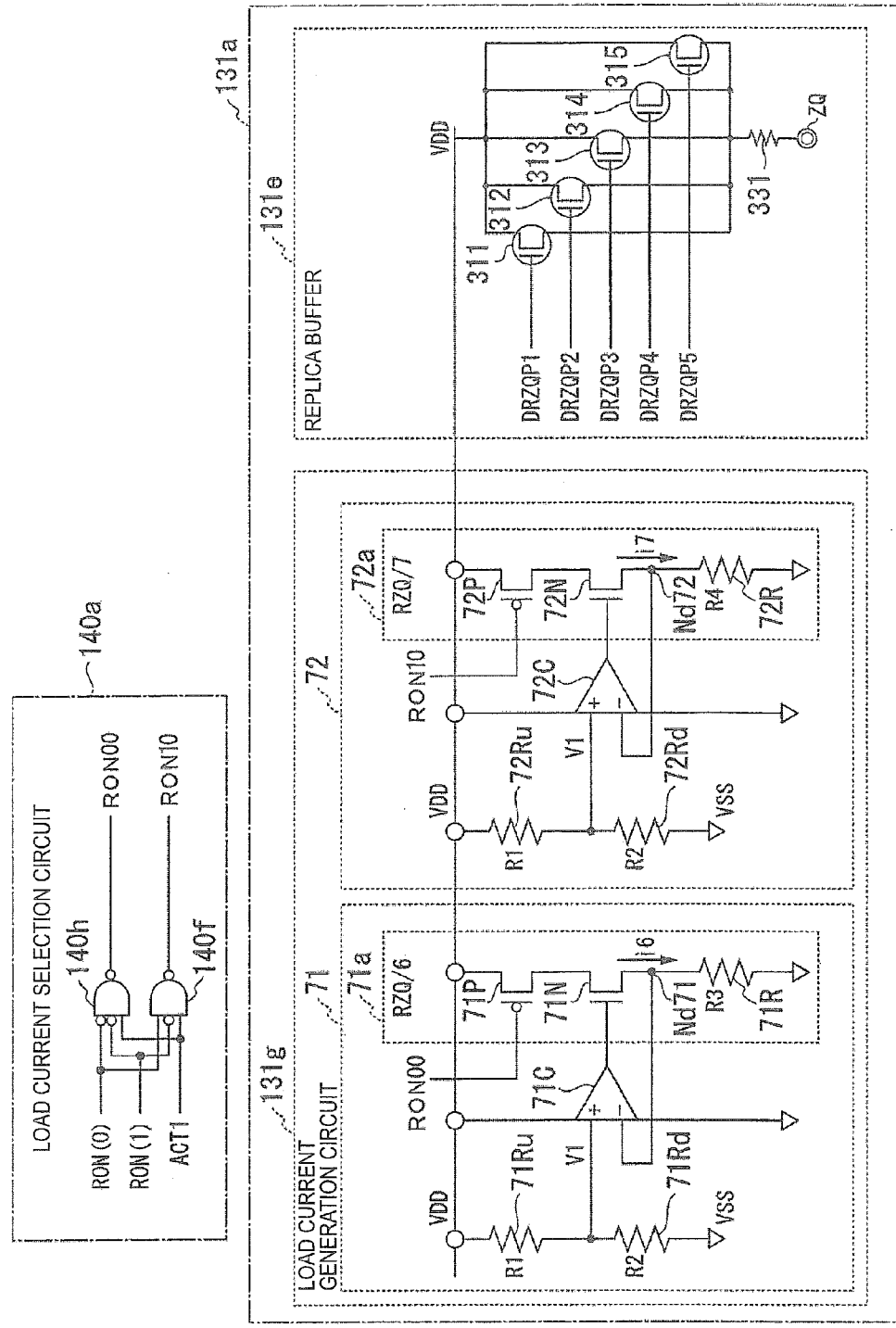
FIG. 12 is a circuit diagram of the pull-up circuit and the load current selection circuit.

FIG. 12 is a diagram corresponding to FIG. 6, showing the circuit configuration of a load current selection circuit 140*a* and a pull-up circuit 131*a*. Incidentally, in FIG. 12, the same components as those in the load current selection circuit 140 and pull-up circuit 131 shown in FIG. 6 are represented by the same reference symbols, and will not be described again.

The load current selection circuit 140*a* is so formed as to include a logic circuit 140*h*, which is a three-input NAND circuit; and a logic circuit 140*f*, which is a three-input NAND circuit.

To the logic circuit 140*h*, the following signals are input: a logically inverted signal of an impedance setting code Ron (0); a logically inverted signal of an impedance setting code Ron (1); and a control signal ACT1.

The logic circuit 140*f* has the same configuration as that of the load current selection circuit 140. To the logic circuit 140*f*, the following signals are input: an impedance setting code Ron (0); a logically inverted signal of an impedance setting code Ron (1); and a control signal ACT1.

That is, as in the case of the load current selection circuit 140, when the impedance setting code Ron (0) is at a L-level, the impedance setting code Ron (1) at a L-level, and the control signal ACT1 at a H-level, the load current selection circuit 140a changes the conduction control signal RON00 from a H-level to a L-level, and keeps the conduction control signal RON10 at a H-level.

When the impedance setting code Ron (0) is at a H-level, the impedance setting code Ron (1) at a L-level, and the control signal ACT1 at a H-level, the load current selection circuit 140a keeps the conduction control signal RON00 at a H-level, and changes the conduction control signal RON10 from a H-level to a L-level.

The pull-up circuit 131a includes a replica circuit 131e and a load current generation circuit 131g. The replica circuit 131e is identical to the replica circuit 131e of the pull-up circuit 131, and therefore will not be described.

The load current generation circuit 131g is different from the load current generation circuit 131f of the pull-up circuit 131: the series circuits each include a voltage-dividing circuit and an operational amplifier.

That is, each portion of the load current generation circuit 131g includes a voltage-dividing circuit and a comparator. The load current generation circuit 131g includes a ×5 load current generation circuit 71 (load current generation unit), which allows current five times as large as the current flowing through the replica circuit 131e to flow through the ×5 load current generation circuit 71 during calibration depending on the number of unit buffers activated; and a ×6 load current generation circuit 72 (load current generation unit), which allows current six times as large as the current to flow through the ×6 load current generation circuit 72.

The ×5 load current generation circuit 71 includes a series circuit 71a, which is connected to the power supply line (VDD) of the replica circuit 131e, a resistor 71Ru, a resistor 71Rd, and an operational amplifier 71c. The ×6 load current generation circuit 72 includes a series circuit 72a, which is connected to the power supply line of the replica circuit 131e, a resistor 72Ru, a resistor 72Rd, and an operational amplifier 72c.

In the ×5 load current generation circuit 71, the series circuit 71a includes a PMOS transistor 71P, a NMOS transistor 71N, and a resistor 71R. The source of the PMOS transistor 71P is connected to the power supply line of the replica circuit 131e. The gate of the PMOS transistor 71P is connected to the load current selection circuit 140a, and a conduction control signal RON00 is input into the gate. The drain of the PMOS transistor 71P is connected to the drain of the NMOS transistor 71N. The drain of the NMOS transistor 71N is connected to the drain of the PMOS transistor 71P. The gate of the NMOS transistor 71N is connected to the output of the operational amplifier 71c. The source of the NMOS transistor 71N is connected to one end (referred to as a connection point Nd71) of the resistor 71R. One end of the resistor 71R (of resistance value R3) is connected to the connection point Nd71, and the other end grounded.

In the ×5 load current generation circuit 71, the resistor 71Ru (of resistance value R1) and the resistor 71Rd (of resistance value R2) make up a voltage-dividing circuit. The voltage-dividing circuit divides the voltage level of the power supply line of the replica circuit 131e, and outputs the resulting voltage level (V1) to an non-inverting input terminal (+) of the operational amplifier 71c.

Meanwhile, the inverting input terminal (−) is connected to the connection point Nd71 of the series circuit 71a. The operational amplifier 71c adjusts the voltage level of the output signal thereof in response to the voltage levels of the two input terminals, and outputs the output signal to the gate of the NMOS transistor 71N of the series circuit 71a.

When the voltage level of the connection point Nd71 is lower than the voltage level (V1), the operational amplifier 71c raises the voltage level of the output signal so that a current driving capability of the NMOS transistor 71N increases. When the voltage level of the connection point Nd71 is higher than the voltage level (V1), the operational amplifier 71c lowers the voltage level of the output signal so that the current driving capability of the NMOS transistor 71N decreases.

In this manner, the resistance value of the resistor 71R of the series circuit 71a is set to the resistance value R3. Therefore, the value of the current flowing through the resistor 71R (indicated by i6 in the diagram) becomes five times as large as the value of the current flowing through the external resistance RZQ at a time when the voltage level of the calibration terminal ZQ is (VDD/2). During the calibration operation, the impedance control signals DRZQ are input into the replica circuit 131e; the impedance control signals DRZQ are adjusted in such a way that the voltage level of the calibration terminal ZQ comes to (VDD/2). Meanwhile, as for the resistor 71R, the operational amplifier 71c adjusts the current driving capability of the NMOS transistor 71N so that the voltage level of one end of the resistor 71R comes to (V1). In this case, as the resistance value R3 is set to V1/((VDD/2)/240Ω×5), the value i6 of the current flowing through the resistor 71R becomes substantially five times as large as the value of the current of the external resistance RZQ.

That is, during the calibration operation, as the L-level conduction control signal RON00 is input and as the PMOS transistor 71P is turned ON, the ×5 load current generation circuit 71 equipped with the series circuit 71a allows the current whose current value i6 is substantially five times as large as the current flowing from the power supply line of the replica circuit 131e into the ground via the external resistance RZQ connected to the calibration terminal ZQ to flow through the ×5 load current generation circuit 71. As a result, the voltage level of the power supply line of the replica circuit 131e drops.

Similarly to the ×5 load current generation circuit 71, in the ×6 load current generation circuit 72, the series circuit 72a includes a PMOS transistor 72P, a NMOS transistor 72N, and a resistor 72R. The source of the PMOS transistor 72P is connected to the power supply line of the replica circuit 131e. The gate of the PMOS transistor 72P is connected to the load current selection circuit 140a, and a conduction control signal RON10 is input into the gate. The drain of the PMOS transistor 72P is connected to the drain of the NMOS transistor 72N. The drain of the NMOS transistor 72N is connected to the drain of the PMOS transistor 72P. The gate of the NMOS transistor 72N is connected to the output of the operational amplifier 72c. The source of the NMOS transistor 72N is connected to one end (referred to as a connection point Nd72) of the resistor 72R. One end of the resistor 72R (of resistance value R4) is connected to the connection point Nd72, and the other end grounded.

In the ×6 load current generation circuit 72, the resistor 72Ru (of resistance value R1) and the resistor 72Rd (of resistance value R2) make up a voltage-dividing circuit. The voltage-dividing circuit divides the voltage level of the power supply line of the replica circuit 131e, and outputs the resulting voltage level (V1) to an non-inverting input terminal (+) of the operational amplifier 72c.

Meanwhile, the inverting input terminal (−) is connected to the connection point Nd72 of the series circuit 72a. The operational amplifier 72c adjusts the voltage level of the output signal thereof in response to the voltage levels of the two input terminals, and outputs the output signal to the gate of the NMOS transistor 72N of the series circuit 72a.

When the voltage level of the connection point Nd72 is lower than the voltage level (V1), the operational amplifier 72c raises the voltage level of the output signal so that a current driving capability of the NMOS transistor 72N increases. When the voltage level of the connection point Nd72 is higher than the voltage level (V1), the operational amplifier 72c lowers the voltage level of the output signal so that the current driving capability of the NMOS transistor 72N decreases.

In this manner, the resistance value of the resistor 72R of the series circuit 72a is set to the resistance value R4. Therefore, the value of the current flowing through the resistor 72R (indicated by i7 in the diagram) becomes six times as large as the value of the current flowing through the external resistance RZQ at a time when the voltage level of the calibration terminal ZQ is (VDD/2). During the calibration operation, the impedance control signals DRZQ are input into the replica circuit 131e; the impedance control signals DRZQ are adjusted in such a way that the voltage level of the calibration terminal ZQ comes to (VDD/2). Meanwhile, as for the resistor 72R, the operational amplifier 72c operates to adjust the current driving capability of the NMOS transistor 72N so that the voltage level of one end of the resistor 72R comes to (V1). In this case, as the resistance value R4 is set to V1/((VDD/2)/ 240Ω×6), the value i7 of the current flowing through the resistor 72R becomes substantially six times as large as the value of the current of the external resistance RZQ.

That is, during the calibration operation, as the L-level conduction control signal RON10 is input and as the PMOS transistor 72P is turned ON, the ×6 load current generation circuit 72 equipped with the series circuit 72a allows the current whose current value i7 is substantially six times as large as the current flowing from the power supply line of the replica circuit 131e into the ground via the external resistance RZQ connected to the calibration terminal ZQ to flow through the ×6 load current generation circuit 72. As a result, the voltage level of the power supply line of the replica circuit 131e drops.

In that manner, the load current generation circuit 131g changes the current flowing through the load current generation circuit 131g depending on the number of unit buffers activated during the calibration operation, thereby causing a voltage drop on the power supply line of the replica circuit 131e that is equal in magnitude to a drop in the voltage level of the power supply line to which the activated unit buffers are connected. Therefore, the impedance control signals DRZQ, which are determined during the calibration operation, can be adjusted in such a way as to reflect the number of unit buffers activated.

Incidentally, the resistance values R1 to R4 can be set by running a circuit simulation in such a way as to reflect a unit buffer, the layout configuration of a power supply line to which a unit buffer is connected, the load current generation circuit 131g, and the layout configuration of a power supply line to which the replica circuit 131e is connected.

The above embodiment has been described by focusing on the impedance of the output buffer 101 at data outputting. However, selectively activating unit buffers is also performed during a terminating resistance (ODT) operation. Therefore, the present invention is not limited to the data output operation, and may be applied to the terminating resistance operation, for example. The following provides a brief description of a semiconductor device 10a that carries out the data output operation and the ODT operation.

Figure 13:
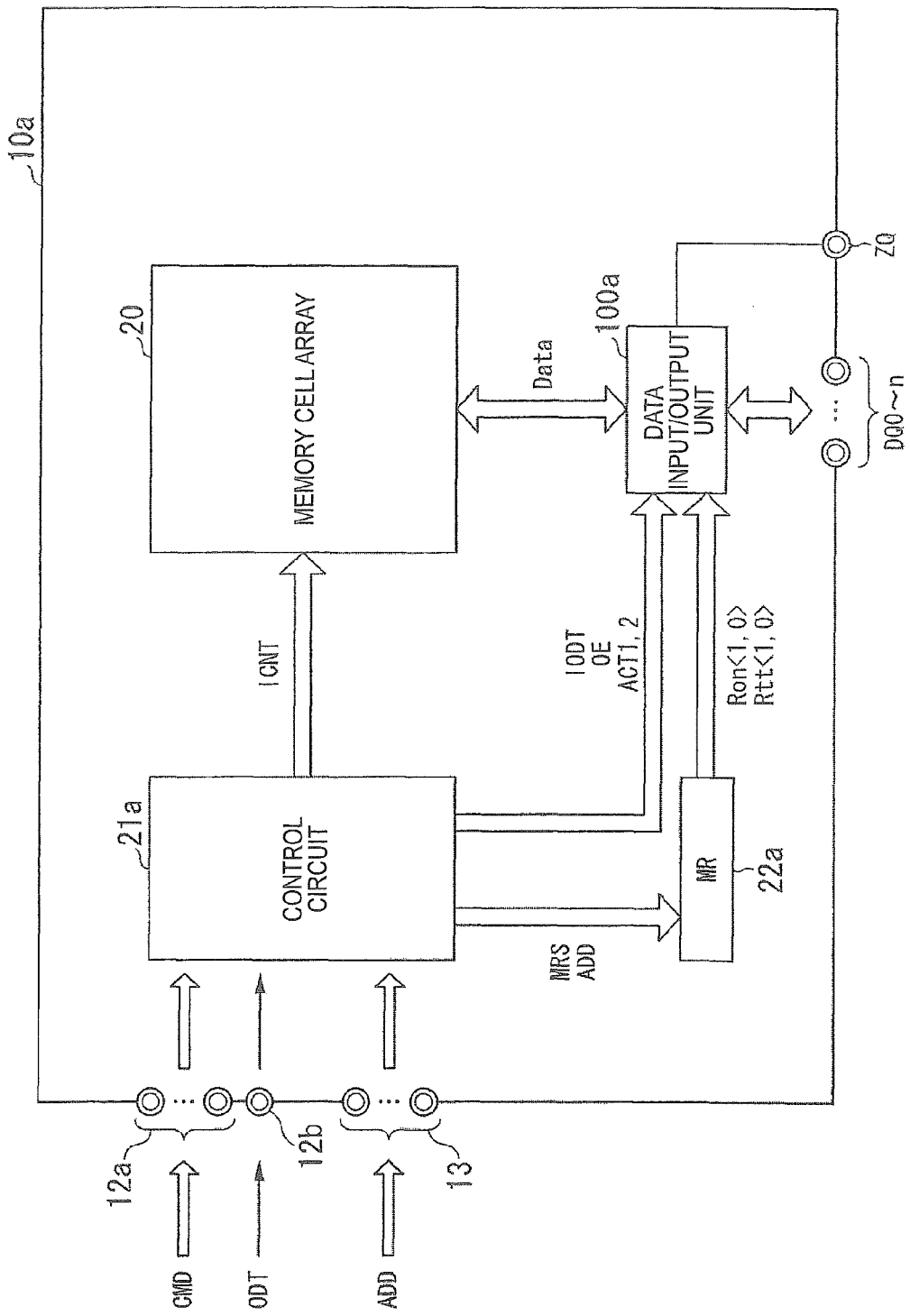
FIG. 13 is a block diagram of the semiconductor device.

FIG. 13 is a block configuration diagram of the semiconductor device 10a, corresponding to FIG. 1 that shows the circuit configuration of the semiconductor device 10. In FIG. 13, the same units as those in FIG. 1 are represented by the same reference symbols, and will not be described.

The semiconductor device 10a has an ODT function, as well as a DS function. The ODT (On-Die Termination) function prevents the reflection of signals by causing an output buffer to function as a terminating resistance at a time when another semiconductor device is transferring data on an external bus to which a data terminal DQ (second terminal) is connected. The semiconductor device 10a enables the ODT function by changing the number of unit buffers activated in accordance with an impedance setting code: the unit buffers make up the output buffer.

In that manner, as opposed to the semiconductor device 10, the semiconductor device 10a further includes an On-Die Termination terminal 12b as an external terminal (or a pad on a semiconductor chip).

The On-Die Termination terminal 12b is a terminal to which an On-Die Termination signal ODT is supplied. The On-Die Termination terminal 12b is connected to a control circuit 21a.

The control circuit 21a controls the activity and non-activity levels of an internal On-Die Termination control signal IODT in accordance with the On-Die Termination signal ODT supplied from outside via the On-Die Termination terminal 12b. Furthermore, when a command indicating the execution of a calibration operation (CAL command) is supplied as a command signal CMD from outside via the command terminals 12a, the control circuit 21a brings (or activates) the control signals ACT1 and ACT2 to a H-level twice, and supplies the control signals ACT1 and ACT2 to the data input/output unit 100. The reason is because an impedance adjustment unit 130b of the data input/output unit 100 carries out a calibration operation of an output buffer corresponding to a data output operation, and a calibration operation of an output buffer corresponding to an ODT operation.

A mode register 22a supplies the following codes to the data input/output unit 100a: an impedance setting code Ron <1, 0> (first setting signal) and an impedance setting code Rtt <1, 0> (second setting signal), which are signals required to set the impedance of an output circuit of a data input/output unit 100a. The impedance setting code Rtt <1, 0> is used at the time of ODT in the data input/output unit 100a. That is, the impedance setting code Rtt <1, 0> is a signal specifying the number of unit buffers to be activated at the time of ODT.

Incidentally, according to the present embodiment, for example, the logic level of an address signal A2 that is among the address signals ADD and is different from an address signal used for the impedance setting code Ron <1, 0> corresponds to and is equal to the logic level of an impedance setting code Rtt <0> in the impedance setting code Rtt <1, 0>; the logic level of an address signal A6 corresponds to and is equal to the logic level of an impedance setting code Rtt <1>. That is, the mode register 22a outputs a H-level or L-level impedance setting code Rtt <0> in response to a H-level or L-level of the address signal A2 to the data input/output unit 100a, and a H-level or L-level impedance setting code Rtt <1> in response to a H-level or L-level of the address signal A6 to the data input/output unit 100a.

The data input/output unit 100a controls the number of unit buffers driving the data terminals DQ0 to DQn at the time of ODT in accordance with the impedance setting code Rtt <1, 0> supplied from the mode register 22a at a time when the internal On-Die Termination control signal IODT supplied from the control circuit 21a is at an activity level (or at a H-level).

Figure 14:
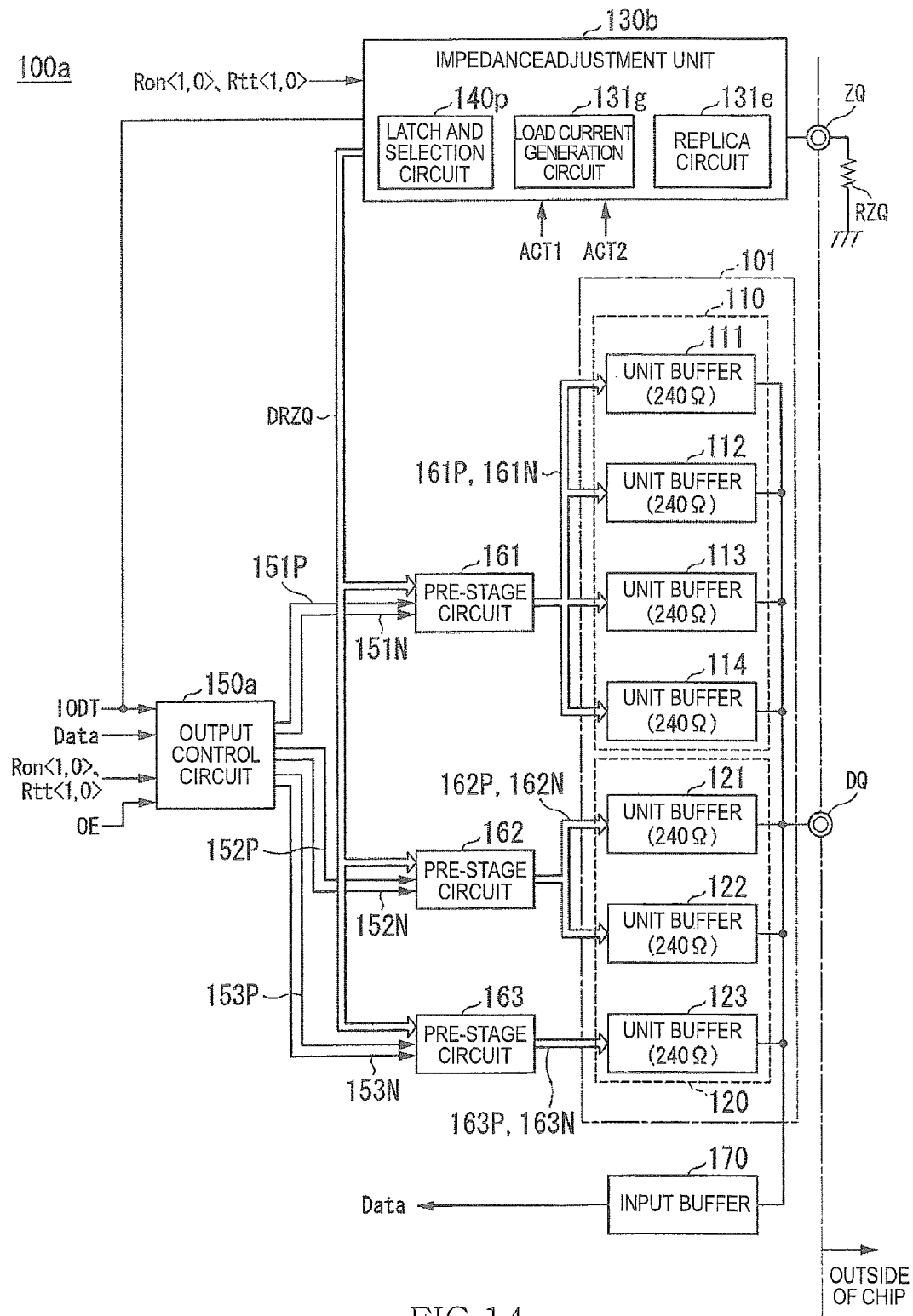
FIG. 14 is a block diagram showing configuration of the data input/output unit.

The following describes the data input/output unit 100a with reference to FIG. 14.

FIG. 14 is a block diagram showing the configuration of the data input/output unit 100a, corresponding to FIG. 2 that shows the configuration of the data input/output unit 100. In FIG. 14, the same units as those in FIG. 2 are represented by the same reference symbols, and will not be described.

An impedance adjustment unit 130b receives from the mode register 22a an impedance setting code Ron <1, 0> and an impedance setting code Rtt <1, 0> as the number of unit buffer circuits activated; and generates an impedance control signal DRZQ1 and an impedance control signal DRZQ2 (or an impedance adjustment signal) on the basis of the setting codes. Depending on the logic level of the internal On-Die Termination control signal IODT, the impedance adjustment unit 130b supplies one of the control signals to a plurality of unit buffers (unit buffers 111 to 114 and 121 to 123) via the pre-stage circuits 161 to 163 as an impedance control signal DRZQ, thereby adjusting the impedances of a plurality of the unit buffers.

An output control circuit 150a specifies unit buffers from among a plurality of unit buffers 111 to 11n to activate, and also specifies an output level for driving a DQ terminal. The unit buffers to be activated are specified in the following manner: the output control circuit 150a receives an impedance setting code Ron <1, 0> and an impedance setting code Rtt <1, 0> from the mode register 22a, and then outputs, on the basis of the setting codes, the selection signals 151P to 153P and the selection signals 151N to 153N to the pre-stage circuits 161 to 163.

Figure 15:
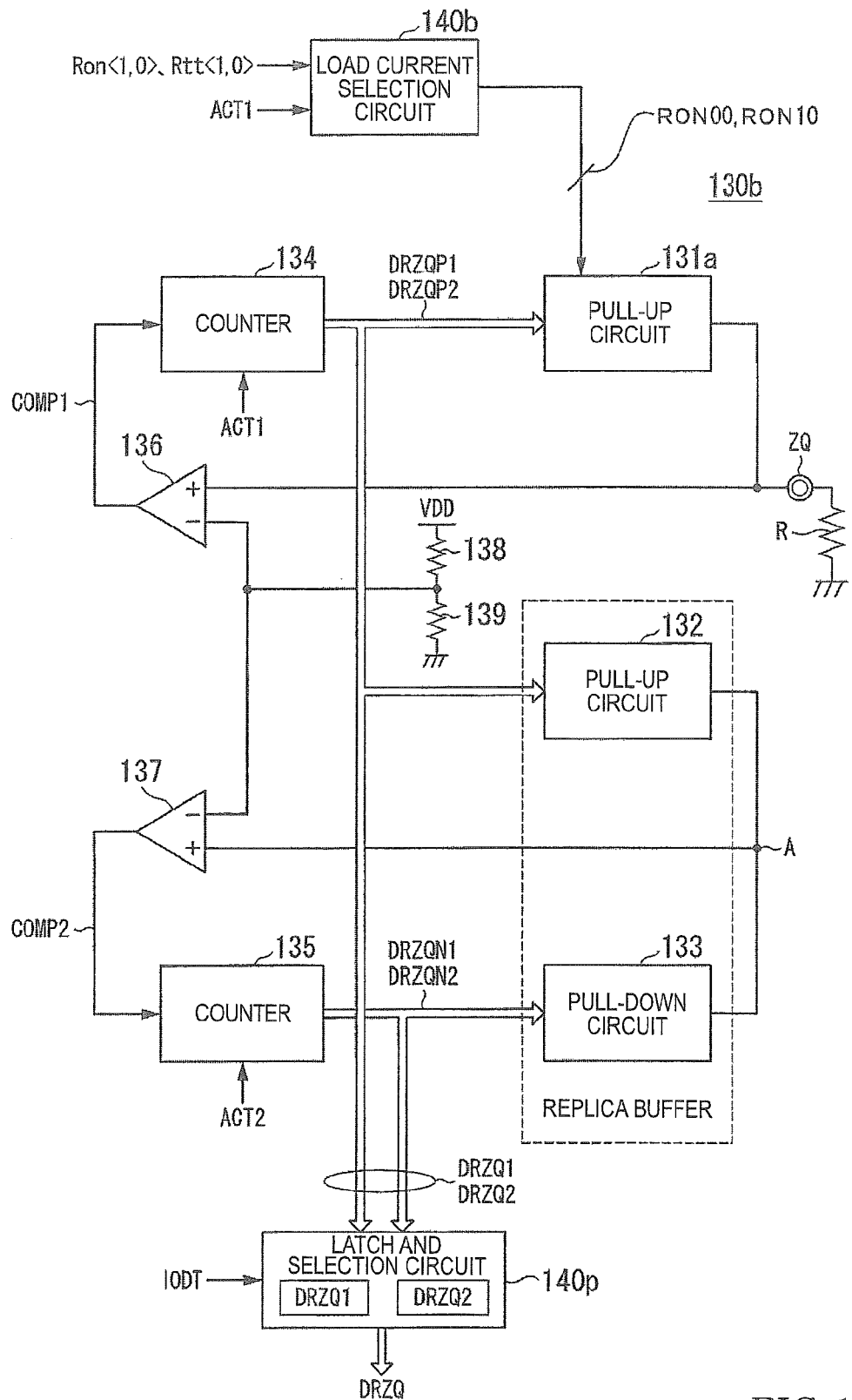
FIG. 15 is a block diagram showing configuration of the impedance adjustment circuit.

FIG. 15 is a block diagram showing the configuration of the impedance adjustment unit 130b, corresponding to FIG. 5 that shows the configuration of the impedance adjustment unit 130. In FIG. 15, the same units as those in FIG. 5 are represented by the same reference symbols, and will not be described.

The impedance adjustment unit 130b includes a load current selection circuit 140b, a pull-up circuit 131a, a pull-up circuit 132, and a pull-down circuit 133. Moreover, the impedance adjustment unit 130b includes a counter 134, which controls the pull-up circuit 132; a counter 135, which controls the pull-down circuit 133; a comparator 136, which controls the counter 134; and a comparator 137, which controls the counter 135.

Furthermore, the impedance adjustment unit 130b includes a latch and selection circuit 140p that latches an impedance control signal DRZQ1 and an impedance control signal DRZQ2, which are generated during a calibration operation, and outputs the impedance control signal DRZQ1 or DRZQ2 to the pre-stage circuits 161 to 163 depending on the internal On-Die Termination control signal IODT.

Figure 16:
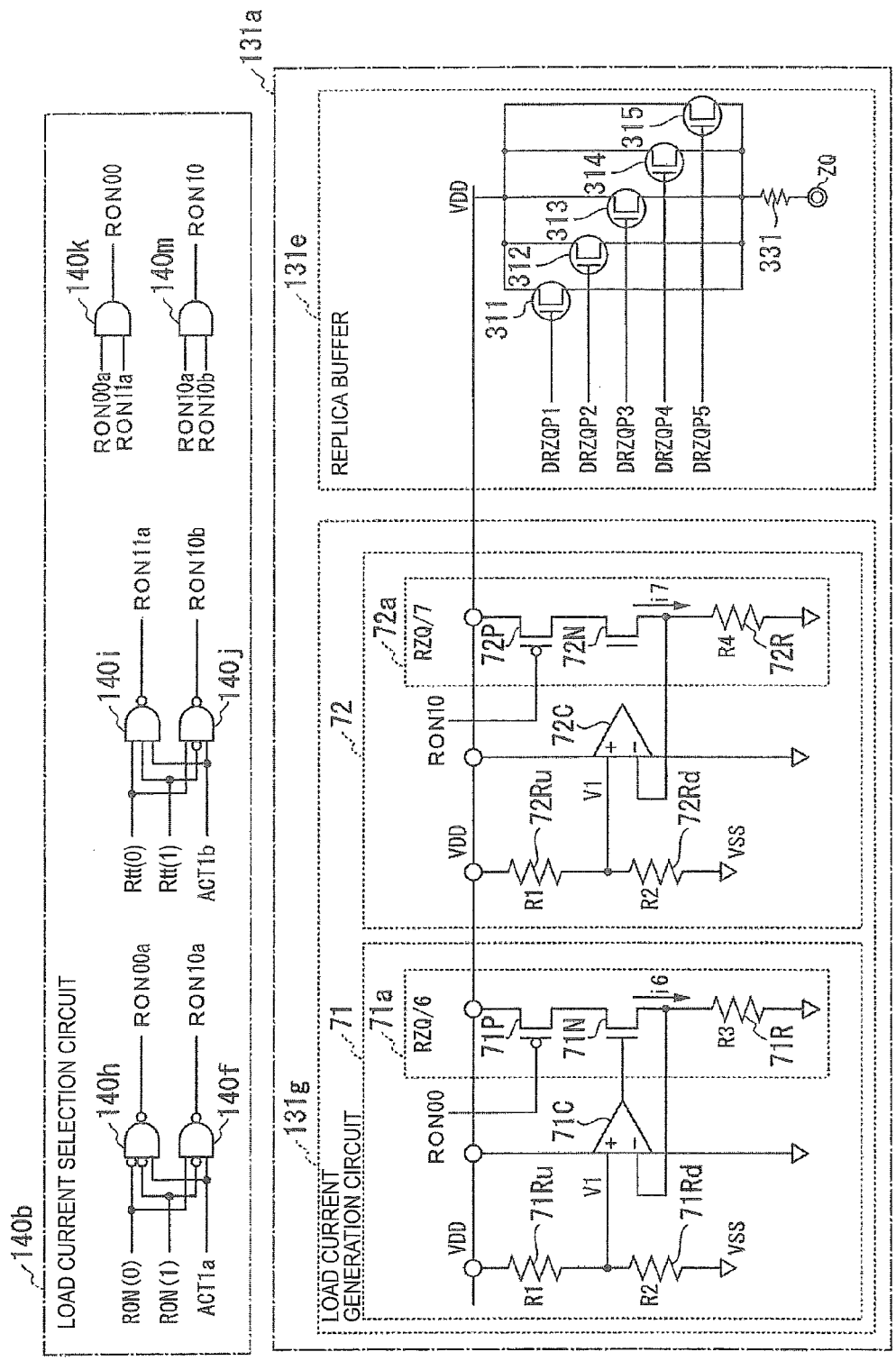
FIG. 16 is a circuit diagram of the pull-up circuit and the load current selection circuit.

FIG. 16 is a circuit diagram of a load current selection circuit 140b and a pull-up circuit 131a, corresponding to FIG. 12 that shows the circuit configuration of the load current selection circuit 140a and the pull-up circuit 131a. In FIG. 16, the same units as those in FIG. 12 are represented by the same reference symbols, and will not be described.

The load current selection circuit 140b is so formed as to include a logic circuit 140h, which is a three-input NAND circuit; a logic circuit 140f, which is a three-input NAND circuit; a logic circuit 140i, which is a three-input NAND circuit; a logic circuit 140j, which is a three-input NAND circuit; an AND circuit 140k; and an AND circuit 140m.

To the logic circuit 140h, the following signals are input: a logically inverted signal of an impedance setting code Ron (0); a logically inverted signal of an impedance setting code Ron (1); and a control signal ACT1a. When all three signals input are at a H-level, the logic circuit 140h outputs a L-level conduction control signal RON00a. When at least one of the three signals input is at a L-level, the logic circuit 140h outputs a H-level conduction control signal RON00a.

To the logic circuit 140f, the following signals are input: an impedance setting code Ron (0); a logically inverted signal of an impedance setting code Ron (1); and a control signal ACT1a. When all three signals input are at a H-level, the logic circuit 140f outputs a L-level conduction control signal RON10a. When at least one of the three signals input is at a L-level, the logic circuit 140f outputs a H-level conduction control signal RON10a.

To the logic circuit 140i, the following signals are input: an impedance setting code Rtt (0); an impedance setting code Rtt (1); and a control signal ACT1b. When all three signals input are at a H-level, the logic circuit 140i outputs a L-level conduction control signal RON11a. When at least one of the three signals input is at a L-level, the logic circuit 140i outputs a H-level conduction control signal RON11a.

To the logic circuit 140j, the following signals are input: an impedance setting code Rtt (0); a logically inverted signal of an impedance setting code Rtt (1); and a control signal ACT1b. When all three signals input are at a H-level, the logic circuit 140j outputs a L-level conduction control signal RON10b. When at least one of the three signals input is at a L-level, the logic circuit 140j outputs a H-level conduction control signal RON10b.

The AND circuit 140k calculates a logical product of the conduction control signal RON00a and the conduction control signal RON11a, and then outputs a conduction control signal RON00.

The AND circuit 140m calculates a logical product of the conduction control signal RON10a and the conduction control signal RON10b, and then outputs a conduction control signal RON10.

When the impedance setting code Ron (0) in the impedance setting code Ron <1, 0> is at a L-level, the impedance setting code Ron (1) at a L-level, and the control signal ACT1a at a H-level, the load current selection circuit 140b changes the conduction control signal RON00 from a H-level to a L-level, and keeps the conduction control signal RON10 at a H-level.

When the impedance setting code Ron (0) in the impedance setting code Ron <1, 0> is at a H-level, the impedance setting code Ron (1) at a L-level, and the control signal ACT1a at a H-level, the load current selection circuit 140b keeps the conduction control signal RON00 at a H-level, and changes the conduction control signal RON10 from a H-level to a L-level.

When the impedance setting code Rtt (0) in the impedance setting code Rtt <1, 0> is at a H-level, the impedance setting code Rtt (1) at a H-level, and the control signal ACT1b at a H-level, the load current selection circuit 140b changes the conduction control signal RON00 from a H-level to a L-level, and keeps the conduction control signal RON10 at a H-level.

When the impedance setting code Rtt (0) in the impedance setting code Rtt <1, 0> is at a H-level, the impedance setting code Rtt (1) at a L-level, and the control signal ACT1b at a H-level, the load current selection circuit 140b keeps the conduction control signal RON00 at a H-level, and changes the conduction control signal RON10 from a H-level to a L-level.

Returning to FIG. 15, when the control circuit 21a activates the control signal ACT1 twice, the counter 134 counts up or down during each activation period. When the control signal ACT1 is deactivated, the counter 134 stops the counting operation. At a time when the control signal ACT1 is changed from an active level to an inactive level for the second time, the counter 134 retains each count value.

When the control circuit 21a activates the control signal ACT2 twice, the counter 135 counts up or down during each activation period. At a time when the control signal ACT2 is changed from an active level to an inactive level for the second time, the counter 135 retains each count value.

At a time when the control signal ACT2 is changed from an active level to an inactive level for the second time, the latch and selection circuit 140p latches the count value of the counter 134 and the count value of the counter 135.

At a time when the control signal ACT2 is changed from an active level to an inactive level for the first time, the latch and selection circuit 140p latches the count value of the counter 134 as an impedance control signal DRZQP1, and the count value of the counter 135 as an impedance control signal DRZQN1. The impedance control signal DRZQP1 and the impedance control signal DRZQN1 are collectively referred to as an impedance control signal DRZQ1, which is adjusted by the load current generation circuit 131g during a calibration so as to reflect the number of unit buffers activated. The latched impedance control signal DRZQ1 is supplied in common to the pre-stage circuits 161 to 163 shown in FIGS. 2 and 4 as an impedance control signal DRZQ at a time when the internal On-Die Termination control signal IODT is at a L-level.

At a time when the control signal ACT2 is changed from an active level to an inactive level for the second time, the latch and selection circuit 140p latches the count value of the counter 134 as an impedance control signal DRZQP2, and the count value of the counter 135 as an impedance control signal DRZQN2. The impedance control signal DRZQP2 and the impedance control signal DRZQN2 are collectively referred to as an impedance control signal DRZQ2, which is adjusted by the load current generation circuit 131g during a calibration so as to reflect the number of unit buffers activated. The latched impedance control signal DRZQ2 is supplied in common to the pre-stage circuits 161 to 163 shown in FIGS. 2 and 4 as an impedance control signal DRZQ at a time when the internal On-Die Termination control signal IODT is at a H-level.

The following describes the data output operation and the ODT operation.

After a read command is supplied from a memory controller, the output control circuit 150a activates unit buffers out of unit buffers 111 to 114 and 121 to 123 of the output buffer 101, with the number of unit buffers activated determined based on an impedance setting code Ron <1, 0> supplied from the mode register 22a. The output control circuit 150a also drives the data terminals DQ to a logic level corresponding to Data supplied from the memory cell array 20. The impedance adjustment unit 130b outputs the impedance control signal DRZQ1 as the impedance control signal DRZQ. Accordingly, after being activated, the pull-up circuits PU and pull-down circuits PD of the unit buffers 111 to 114 and 121 to 123 drive the data terminals with the impedance corresponding to the impedance control signal DRZQ1 supplied from the impedance adjustment unit 130b.

After an On-Die Termination signal is supplied from a memory controller, the output control circuit 150a activates unit buffers out of unit buffers 111 to 114 and 121 to 123 of the output buffer 101, with the number of unit buffers activated determined based on an impedance setting code Rtt <1, 0> supplied from the mode register 22a; and therefore terminates the data terminals DQ. The impedance adjustment unit 130b outputs the impedance control signal DRZQ2 as the impedance control signal DRZQ. Accordingly, after being activated, the pull-up circuits PU and pull-down circuits PD of the unit buffers 111 to 114 and 121 to 123 drive the data terminals with the impedance corresponding to the impedance control signal DRZQ2 supplied from the impedance adjustment unit 130b.

In that manner, the semiconductor device 10a adjusts the impedances of unit buffers during the calibration in accordance with the number of unit buffers activated by the data output operation and the ODT operation. As a result, during the data output operation and the ODT operation, the semiconductor device 10a can keep the impedance of the output circuit from deviating from a target value even when the number of unit buffers activated varies; and it is possible to improve the accuracy of adjusting the impedance of the output circuit (output buffer 101).

Figure 17:
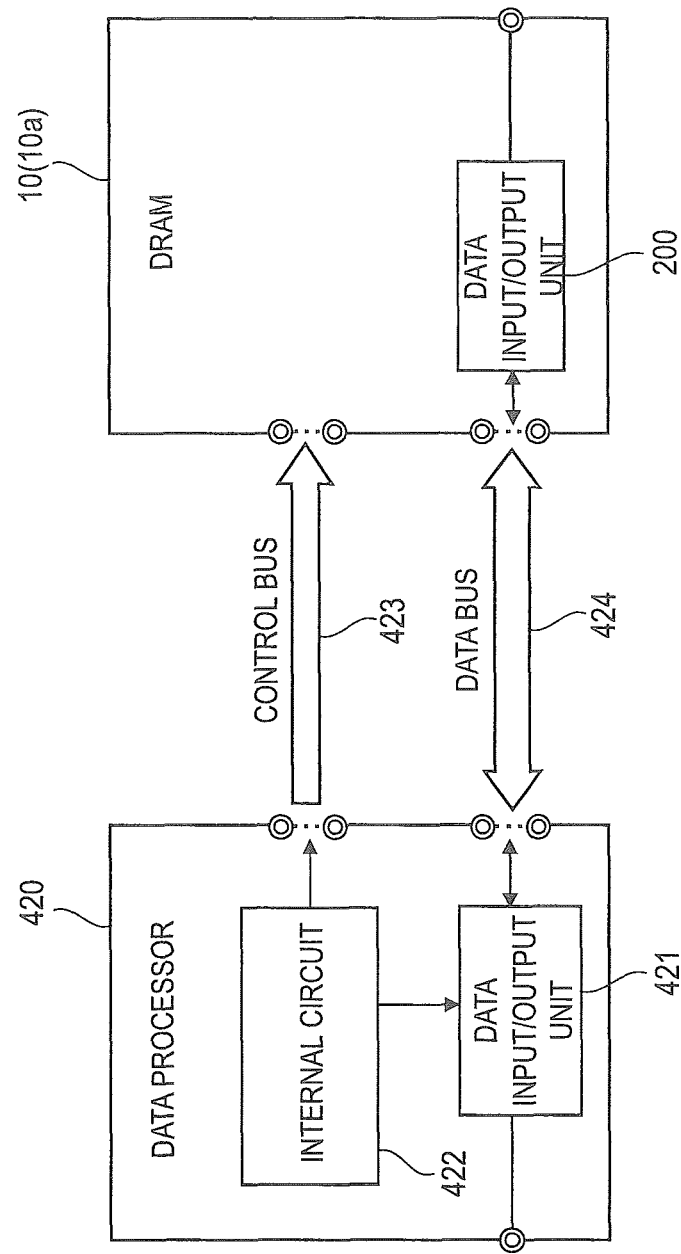
FIG. 17 is a block diagram of the memory system in one embodiment of the present invention.

The following describes a memory system that uses a semiconductor device of the present invention with reference to FIG. 17.

FIG. 17 is a block diagram showing the configuration of a memory system that includes a data processor 420 and a DRAM 10.

As shown in FIG. 17, the data processor 420 and the DRAM 10 (10a) are connected to each other via a control bus 423 and a data bus 424. The control bus 423 is designed to transfer a clock, command, address, and any other control signals from the data processor 420 to the DRAM 10 (10a). The data bus 424 is designed to transfer data between the data processor 420 and the DRAM 10 (10a). In this case, the data are transmitted in both directions between the data processor 420 and the DRAM 10 (10a). Accordingly, as shown in FIG. 17, the data processor 420 also includes a data input/output unit 421. In the description of the above embodiment, a data input/output unit 200 of the DRAM 10 (10a) is described in detail. The data input/output circuit 421 of the data processor 420 may have a similar impedance adjustment function to that of the data input/output circuit 100 (100a) of the DRAM 10 (10a).

The technical concept of the present application can be applied to semiconductor devices having various functions other than the memory function. Furthermore, the circuitry form in each of the circuit blocks disclosed in the drawings, as well as a circuit that generates other control signals, is not limited to the circuitry form disclosed in the examples. For example, according to the above embodiment, the output buffer 101 includes seven unit buffers, and activates six or seven unit buffers when the data output operation and the ODT operation are performed. However, the total number of unit buffers is not specifically limited, as long as the number is two or more. Moreover, the number of unit buffers activated during the data output operation or ODT operation is not specifically limited.

The technical concept of the present invention may be applied to, for example, semiconductor products in general, including CPUs (Central Processing Units), MCUs (Micro Control Units), DSPs (Digital Signal Processors), ASICs (Application Specific Integrated Circuits), ASSPs (Application Specific Standard Product), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types. When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

The N-channel transistors or NMOS transistors are a representative example of the transistor of first conductivity type. The P-channel transistors or PMOS transistors are a representative example of the transistor of second conductivity type.

It is apparent that the present invention is not limited to the above embodiments, but may be modified and changed without departing from the scope and spirit of the invention.

The invention claimed is:

1. A semiconductor device comprising:
an output circuit having a plurality of unit buffer circuits, wherein an impedance of each unit buffer circuit of the plurality of unit buffer circuits is adjustable;
a control circuit configured to selectively activate one or more unit buffer circuits of the plurality of unit buffer circuits; and
an impedance adjustment unit configured to adjust the impedance of each of the unit buffer circuits of the plurality of unit buffer circuits, wherein the impedance adjustment unit comprises a first power line, a replica circuit, and a load current generation circuit, and wherein the replica circuit and the load current generation circuit are coupled in common to the first power line, the replica circuit has a replica impedance that is substantially equal to the impedance of the output circuit, and the load current generation circuit changes current flowing therethrough in accordance with a number of the activated one or more unit buffer circuits of the plurality of unit buffer circuits, and wherein the load current generation circuit comprises a comparator having an output that is used to selectively change the current flowing through the load current generation circuit.

2. The semiconductor device of claim 1, further comprising a first terminal coupled to the replica circuit and configured to be coupled to an external resistor having a predetermined resistance value, and wherein the impedance adjustment unit generates an impedance adjustment signal such that the replica impedance of the replica circuit becomes substantially equal to the resistance value of the external resistor, and the impedance adjustment unit supplies the impedance adjustment signal to each of the unit buffer circuits of the plurality of unit buffer circuits to adjust the impedance of each of the unit buffer circuits.

3. The semiconductor device of claim 2, wherein the replica circuit enables a first current to flow in accordance with the impedance adjustment signal between the first power line and a second power line, the first power line being coupled to a power supply, the second power line being coupled to the external resistor, and the load current generation circuit enables a second current whose quantity is substantially equal to a value calculated by subtracting one from the number of activated one or more of the unit buffer circuits of the plurality of unit buffer circuits and multiplying a resultant value by a quantity of the first current to flow from the first power line to a third power line, the third power line being supplied with substantially the same potential as the second power line.

4. The semiconductor device of claim 3, wherein the load current generation circuit includes a plurality of series circuits, each of the series circuits including a resistor having a first node coupled to the third power line, a first transistor coupled to a second node of the resistor, and a second transistor coupled between the first transistor and the first power line, and wherein the comparator of the load current generation circuit includes an operational amplifier that provides an output to adjust a voltage level provided to the first transistor of each of the series circuits, wherein the output is produced by comparing a voltage level of the second node of the resistor of one of the series circuits with a voltage level at the first terminal, and the load current generation circuit enables the second current to flow to the third power line when the first and second transistors included in at least one of the series circuits are brought into an ON state.

5. The semiconductor device of claim 3, wherein the load current generation circuit includes a plurality of load current generation units, each of the load current generation units of the plurality of load current generation units includes a resistor having a first node coupled to the third power line, a first transistor coupled to a second node of the resistor, and a second transistor coupled between the first transistor and the first power line, the load current generation circuit further includes:
a voltage-dividing circuit that divides a voltage level of the first power line to generate a divided voltage;
wherein the comparator controls the first transistor of each of the load current generation units of the plurality of load current generation units by comparing a voltage level of the second node of the resistor of one of the load current generation units with the divided voltage, and each of the load current generation units of the plurality of load current generation units enables the second current to flow to the third power line according to the divided voltage when the first and second transistors included therein are brought into an ON state.

6. The semiconductor device of claim 4, further comprising a mode register indicating the number of the unit buffer circuits of the plurality of unit buffer circuits to be activated, wherein the control circuit outputs a setting signal based on an output signal of the mode register, and the impedance adjustment unit includes a load current selection circuit that selectively brings the second transistor of each of the series circuits into an ON state based on the setting signal.

7. The semiconductor device of claim 6, further comprising a second terminal, wherein each unit buffer circuit of the plurality of unit buffer circuits includes a pull-up circuit that drives the second terminal to a voltage level of the first power line and a pull-down circuit that drives the second terminal to a voltage level of the second power line, the setting signal includes a first setting signal and a second setting signal, and wherein when a read command that instructs the semiconductor device to read a data from an internal circuit and output the data to the second terminal is issued to the semiconductor device, the control circuit activates one of the pull-up circuit and the pull-down circuit included in the selected one or more of the unit buffer circuits of the plurality of unit buffer circuits in accordance with the first setting signal, thereby driving the second terminal, and when an On-Die Termination signal that instructs the output circuit to function as a terminating resistor is issued to the semiconductor device, the control circuit activates both the pull-up circuit and the pull-down circuit included in the selected one or more of the unit buffer circuits in accordance with the second setting signal, thereby driving the second terminal.

8. A device comprising:
a first terminal;
a plurality of output buffers coupled in common to the first terminal;

an output control circuit configured to receive a first control signal and to activate one or more output buffers of the plurality of output buffers in response to the first control signal; and an impedance adjustment unit comprising a replica circuit, a plurality of current generation circuits, and a power line, wherein the replica circuit and each current generation circuit of the plurality of current generation circuits are coupled in common to the power line, the impedance adjustment unit is configured to adjust an impedance of each output buffer of the plurality of output buffers in response to an impedance of the replica circuit, and wherein the impedance adjustment unit comprises a current control circuit configured to receive the first control signal and to activate one or more of the current generation circuits of the plurality of current generation circuits in response to the first control signal, and wherein the current control circuit comprises a comparator having an output that is used to selectively change the current flowing through the current control circuit.

9. The device of claim 8, further comprising a mode resistor circuit configured to store information to indicate a number of the one or more output buffers of the plurality of output buffers and to supply the first control signal to the output control circuit and to the impedance adjustment unit in response to the information.

10. The device of claim 8, wherein the impedance adjustment unit is configured to supply a second control signal to the output control circuit in response to the impedance of the replica circuit, and the output control circuit is configured to adjust the impedance of each output buffer of the plurality of output buffers in response to the second control signal.

11. The device of claim 8, wherein each current generation circuit of the plurality of current generation circuits of the impedance adjustment unit is configured to apply a first current thereto, the first current being substantially equal to a current that is applied to the replica circuit of the impedance adjustment unit.

12. The device of claim 8, further comprising a second terminal configured to be coupled to an external resistor that has a first resistance value, and wherein each current generation circuit of the plurality of current generation circuits of the impedance adjustment unit comprises a second resistor having a second resistive value that is substantially equal to the first resistive value.

13. The device of claim 12, wherein the replica circuit is coupled to the second terminal.

14. The device of claim 12, wherein each current generation circuit of the plurality of current generation circuits includes a transistor coupled between the second resistor and the power line, the transistor of each of the current generation circuits includes a control node coupled to the current control circuit.

15. A system comprising:
a control device; and
a memory device coupled to the control device, the memory device comprising;
    a first terminal coupled to the control device;
a plurality of output buffers coupled in common to the first terminal;
an output control circuit configured to receive a first control signal and to activate one or more output buffers of the plurality of output buffers in response to the first control signal; and
an impedance adjustment unit including a replica circuit, a plurality of current generation circuits, and a power line, wherein the replica circuit and each current generation circuit of the plurality of current generation circuits are coupled in common to the power line, the impedance adjustment unit is configured to adjust an impedance of each output buffer of the plurality of output buffers in response to an impedance of the replica circuit, and wherein the impedance adjustable circuit comprises a current control circuit configured to receive the first control signal and to activate one or more current generation circuits of the plurality of current generation circuits in response to the first control signal, and wherein the current control circuit comprises a comparator having an output that is used to selectively change a current flowing through the current control circuit.

16. The system of claim 15, wherein the memory device comprises a mode resistor circuit configured to store information that is used to indicate a number of the one or more output buffers of the plurality of output buffers and to supply the first control signal to the output control circuit and to the impedance adjustment unit in response to the information.

17. The system of claim 15, wherein the impedance adjustment unit of the memory device is configured to supply a second control signal to the output control circuit in response to the impedance of the replica circuit, and the output control circuit is configured to adjust the impedance of each output buffer of the plurality of output buffers in response to the second control signal.

18. The system of claim 15, wherein each current generation circuit of the plurality of current generation circuits of the impedance adjustment unit of the memory device is configured to apply a first current thereto, wherein the first current is substantially equal to a current that is applied to the replica circuit of the impedance adjustment circuit.

19. The system of claim 15, wherein the memory device comprises a second terminal configured to be coupled to an external resistor that has a first resistance value, and each current generation circuit of the plurality of current generation circuits of the impedance adjustment unit of the memory device includes a second resistor having a second resistive value that is substantially equal to the first resistive value.

20. The system of claim 19, wherein the replica circuit of the adjustment unit of the memory device is coupled to the second terminal.

* * * * *